United States Patent
Hiyoshi et al.

(10) Patent No.: US 10,756,188 B2
(45) Date of Patent: Aug. 25, 2020

(54) SILICON CARBIDE SEMICONDUCTOR DEVICE AND METHOD OF MANUFACTURING THE SAME

(71) Applicants: Sumitomo Electric Industries, Ltd., Osaka-shi (JP); NATIONAL INSTITUTE OF ADVANCED INDUSTRIAL SCIENCE AND TECHNOLOGY, Tokyo (JP)

(72) Inventors: Toru Hiyoshi, Osaka (JP); Takeyoshi Masuda, Tsukuba (JP); Ryouji Kosugi, Tsukuba (JP)

(73) Assignees: Sumitomo Electric Industries, Ltd., Osaka-shi (JP); National Institute of Advanced Industrial Science and Technology, Tokyo (JP)

( * ) Notice: Subject to any disclaimer, the term of this patent is extended or adjusted under 35 U.S.C. 154(b) by 52 days.

(21) Appl. No.: 16/092,494

(22) PCT Filed: Mar. 22, 2017

(86) PCT No.: PCT/JP2017/011409
§ 371 (c)(1),
(2) Date: Oct. 10, 2018

(87) PCT Pub. No.: WO2017/179377
PCT Pub. Date: Oct. 19, 2017

(65) Prior Publication Data
US 2019/0074360 A1   Mar. 7, 2019

(30) Foreign Application Priority Data
Apr. 14, 2016  (JP) .................. 2016-081118

(51) Int. Cl.
*H01L 29/16* (2006.01)
*H01L 29/12* (2006.01)
(Continued)

(52) U.S. Cl.
CPC .... *H01L 29/1608* (2013.01); *H01L 21/02378* (2013.01); *H01L 21/046* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 2013/0181229 A1* | 7/2013 | Masuda | H01L 29/6606 257/77 |
| 2015/0221731 A1* | 8/2015 | Zeng | H01L 29/7395 257/139 |

(Continued)

FOREIGN PATENT DOCUMENTS

| | | |
|---|---|---|
| JP | 2012-064659 A | 3/2012 |
| JP | 2013-165197 A | 8/2013 |
| JP | 2013-165198 A | 8/2013 |

*Primary Examiner* — Nduka E Ojeh
(74) *Attorney, Agent, or Firm* — Baker Botts L.L.P.; Michael A. Sartori

(57) ABSTRACT

A silicon carbide semiconductor device includes a silicon carbide substrate and a gate insulating film. The silicon carbide substrate includes a first impurity region, a second impurity region, a third impurity region, a fourth impurity region, a fifth impurity region, and a sixth impurity region. A first main surface of the silicon carbide substrate is provided with a trench defined by a side surface and a bottom portion. The sixth impurity region includes a first region which faces the bottom portion and a second region which faces a second main surface of the silicon carbide substrate. The first region is higher in impurity concentration than the second region. In a direction perpendicular to the second main surface, a fifth main surface of the fourth impurity region is located between a sixth main surface of the second impurity region and the second main surface.

18 Claims, 24 Drawing Sheets

(51) Int. Cl.
*H01L 29/78* (2006.01)
*H01L 21/02* (2006.01)
*H01L 21/04* (2006.01)
*H01L 29/417* (2006.01)
*H01L 29/423* (2006.01)
*H01L 29/51* (2006.01)
*H01L 29/66* (2006.01)

(52) U.S. Cl.
CPC ............ *H01L 21/049* (2013.01); *H01L 29/12* (2013.01); *H01L 29/41741* (2013.01); *H01L 29/4236* (2013.01); *H01L 29/517* (2013.01); *H01L 29/66068* (2013.01); *H01L 29/66734* (2013.01); *H01L 29/78* (2013.01); *H01L 29/7813* (2013.01)

(56) References Cited

U.S. PATENT DOCUMENTS

| | | | |
|---|---|---|---|
| 2016/0225854 A1* | 8/2016 | Wada | H01L 29/7802 |
| 2017/0133466 A1* | 5/2017 | Shiomi | H01L 29/66068 |
| 2018/0076285 A1* | 3/2018 | Tanaka | H01L 21/0465 |
| 2018/0315813 A1* | 11/2018 | Shiomi | H01L 21/0465 |
| 2019/0040545 A1* | 2/2019 | Nakamura | H01L 29/8613 |

* cited by examiner

— SAMPLE 1 (IMPURITY CONCENTRATION IN CURRENT SPREAD LAYER: $5 \times 10^{15} cm^{-3}$)
------ SAMPLE 2 (IMPURITY CONCENTRATION IN CURRENT SPREAD LAYER: $1 \times 10^{16} cm^{-3}$)
—·— SAMPLE 3 (IMPURITY CONCENTRATION IN CURRENT SPREAD LAYER: $1 \times 10^{17} cm^{-3}$)
—··— SAMPLE 4 (IMPURITY CONCENTRATION IN CURRENT SPREAD LAYER: $1 \times 10^{18} cm^{-3}$)

SILICON CARBIDE SEMICONDUCTOR DEVICE AND METHOD OF MANUFACTURING THE SAME

TECHNICAL FIELD

The present disclosure relates to a silicon carbide semiconductor device and a method of manufacturing the same. The present application claims priority to Japanese Patent Application No. 2016-081118 filed on Apr. 14, 2016, the entire contents of which are herein incorporated by reference.

BACKGROUND ART

For example, Japanese Patent Laying-Open No. 2012-64659 (PTD 1), Japanese Patent Laying-Open No. 2013-165197 (PTD 2), and Japanese Patent Laying-Open No. 2013-165198 (PTD 3) each disclose a trench-type metal oxide semiconductor field effect transistor (MOSFET) in which a gate trench is provided in a main surface of a silicon carbide substrate. In the silicon carbide substrate, a super junction structure in which an n-type region and a p-type region are alternately and repeatedly arranged is provided.

CITATION LIST

Patent Document

PTD 1: Japanese Patent Laying-Open No. 2012-64659
PTD 2: Japanese Patent Laying-Open No. 2013-165197
PTD 3: Japanese Patent Laying-Open No. 2013-165198

SUMMARY OF INVENTION

A silicon carbide semiconductor device according to the present disclosure includes a silicon carbide substrate, a gate insulating film, a first electrode, and a second electrode. The silicon carbide substrate includes a first main surface and a second main surface opposite to the first main surface. The silicon carbide substrate includes a first impurity region having a first conductivity type, a second impurity region which is provided on the first impurity region and has a second conductivity type different from the first conductivity type, a third impurity region which is provided on the second impurity region as being distant from the first impurity region and has the first conductivity type, a fourth impurity region which penetrates the third impurity region and the second impurity region, is in contact with the first impurity region, and has the second conductivity type, a fifth impurity region which is in contact with the first impurity region and located between the first impurity region and the second main surface and has the first conductivity type, and a sixth impurity region which is in contact with the fifth impurity region and has the second conductivity type. The first main surface is provided with a trench defined by a side surface which penetrates the third impurity region and the second impurity region and reaches the first impurity region and a bottom portion continuous to the side surface. The sixth impurity region includes a first region which includes a third main surface facing the bottom portion and a second region which is in contact with the first region and includes a fourth main surface facing the second main surface. The first region is higher in impurity concentration than the second region. The fourth impurity region includes a fifth main surface which faces the second main surface. The second impurity region includes a sixth main surface which faces the second main surface. In a direction perpendicular to the second main surface, the fifth main surface is located between the sixth main surface and the second main surface. The gate insulating film is in contact with the side surface and the bottom portion. The first electrode is in contact with the third impurity region and the fourth impurity region in the first main surface. The second electrode is in contact with the second main surface.

A method of manufacturing a silicon carbide semiconductor device according to the present disclosure includes steps below. A silicon carbide substrate including a first main surface and a second main surface opposite to the first main surface is prepared. A gate insulating film in contact with a side surface and a bottom portion is formed. A first electrode in contact with a third impurity region and a fourth impurity region in the first main surface is formed. A second electrode in contact with the second main surface is formed. The silicon carbide substrate includes a first impurity region having a first conductivity type, a second impurity region which is provided on the first impurity region and has a second conductivity type different from the first conductivity type, the third impurity region which is provided on the second impurity region as being distant from the first impurity region and has the first conductivity type, the fourth impurity region which penetrates the third impurity region and the second impurity region, is in contact with the first impurity region, and has the second conductivity type, a fifth impurity region which is in contact with the first impurity region and located between the first impurity region and the second main surface and has the first conductivity type, and a sixth impurity region which is in contact with the fifth impurity region and has the second conductivity type. The first main surface is provided with a trench defined by the side surface which penetrates the third impurity region and the second impurity region and reaches the first impurity region and the bottom portion continuous to the side surface. The sixth impurity region includes a first region which includes a third main surface facing the bottom portion and a second region which is in contact with the first region and includes a fourth main surface facing the second main surface. The first region is higher in impurity concentration than the second region. The fourth impurity region includes a fifth main surface which faces the second main surface. The second impurity region includes a sixth main surface which faces the second main surface. In a direction perpendicular to the second main surface, the fifth main surface is located between the sixth main surface and the second main surface.

DETAILED DESCRIPTION

Figure 1:
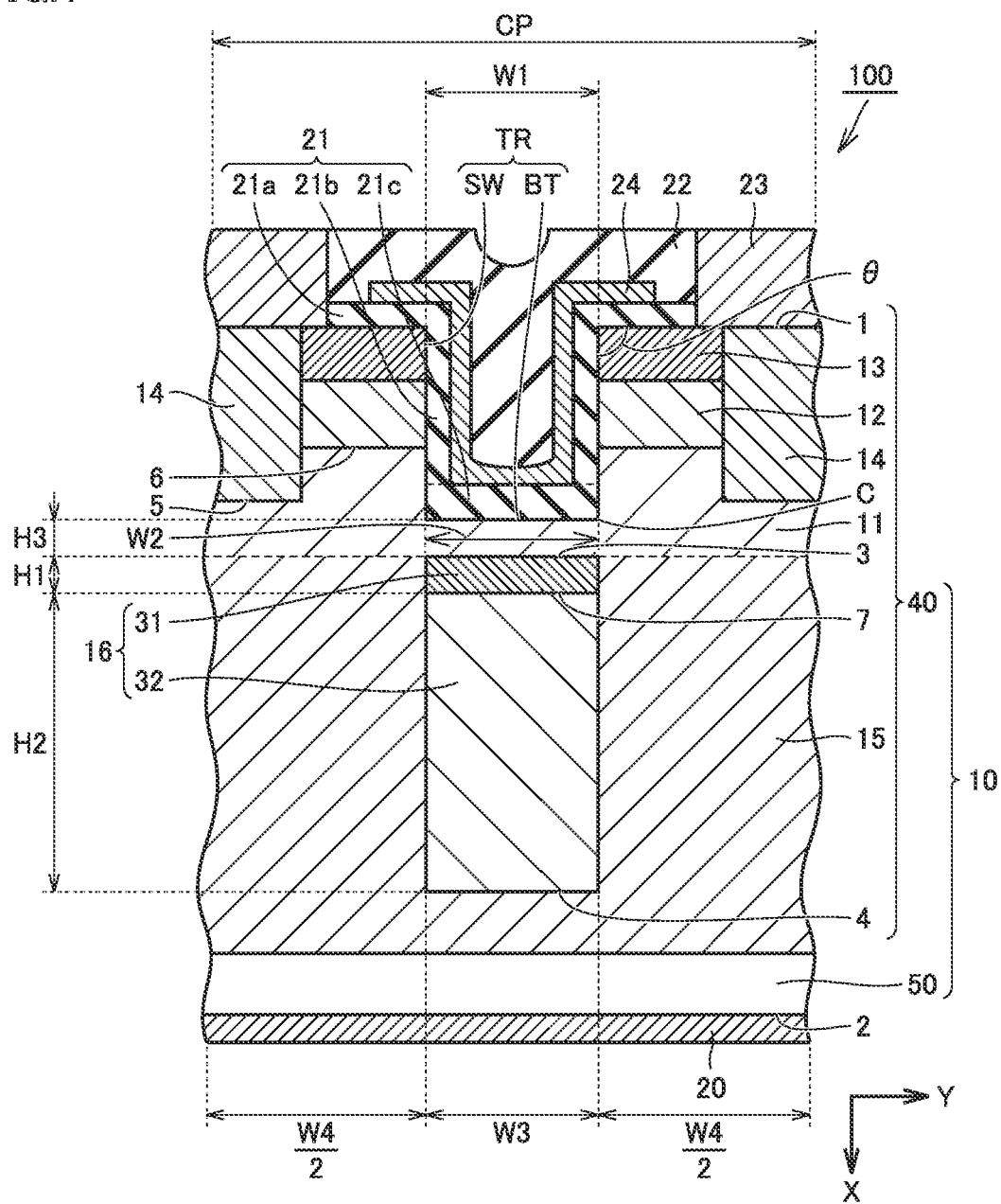
FIG. 1 is a schematic cross-sectional view showing a construction of a silicon carbide semiconductor device according to the present embodiment.

Problem to be Solved by the Present Disclosure

An object of the present disclosure is to provide a silicon carbide semiconductor device capable of relaxing concentration of electric field at a bottom portion of a gate insulating film and a method of manufacturing the same.

Effect of the Present Disclosure

According to the present disclosure, a silicon carbide semiconductor device capable of relaxing concentration of electric field at a bottom portion of a gate insulating film and a method of manufacturing the same can be provided.

Summary of Embodiment of the Present Disclosure

Overview of an embodiment of the present disclosure will initially be described. Regarding crystallographic denotation herein, an individual orientation, a group orientation, an individual plane, and a group plane are shown in [ ], < >, ( ) and { }, respectively. A crystallographically negative index is normally expressed by a number with a bar "–" thereabove, however, a negative sign herein precedes a number.

(1) A silicon carbide semiconductor device 100 according to the present disclosure includes a silicon carbide substrate 10, a gate insulating film 21, a first electrode 23, and a second electrode 20. Silicon carbide substrate 10 includes a first main surface 1 and a second main surface 2 opposite to first main surface 1. Silicon carbide substrate 10 includes a first impurity region 11 having a first conductivity type, a second impurity region 12 which is provided on first impurity region 11 and has a second conductivity type different from the first conductivity type, a third impurity region 13 which is provided on second impurity region 12 as being distant from first impurity region 11 and has the first conductivity type, a fourth impurity region 14 which penetrates third impurity region 13 and second impurity region 12, is in contact with first impurity region 11, and has the second conductivity type, a fifth impurity region 15 which is in contact with first impurity region 11 and located between first impurity region 11 and second main surface 2 and has the first conductivity type, and a sixth impurity region 16 which is in contact with fifth impurity region 15 and has the second conductivity type. First main surface 1 is provided with a trench TR defined by a side surface SW which penetrates third impurity region 13 and second impurity region 12 and reaches first impurity region 11 and a bottom portion BT continuous to side surface SW. Sixth impurity region 16 includes a first region 31 which includes a third main surface 3 facing bottom portion BT and a second region 32 which is in contact with first region 31 and includes a fourth main surface 4 facing second main surface 2. First region 31 is higher in impurity concentration than second region 32. Fourth impurity region 14 includes a fifth main surface 5 which faces the second main surface. Second impurity region 12 includes a sixth main surface 6 which faces second main surface 2. In a direction perpendicular to second main surface 2, fifth main surface 5 is located between sixth main surface 6 and second main surface 2. Gate insulating film 21 is in contact with side surface SW and bottom portion BT. First electrode 23 is in contact with third impurity region 13 and fourth impurity region 14 in first main surface 1. Second electrode 20 is in contact with second main surface 2.

According to silicon carbide semiconductor device 100 according to (1), silicon carbide substrate 10 includes fifth impurity region 15 having the first conductivity type and sixth impurity region 16 which is in contact with fifth impurity region 15 and has the second conductivity type. Fifth impurity region 15 and sixth impurity region 16 form a super junction structure in which they mutually compensate for charges. Therefore, a breakdown voltage of silicon carbide semiconductor device 100 can be improved.

Sixth impurity region 16 includes first region 31 which includes third main surface 3 facing bottom portion BT and second region 32 which is in contact with first region 31 and includes fourth main surface 4 facing second main surface 2. Thus, even when second region 32 is completely depleted in application of a reverse bias to the silicon carbide semiconductor device, complete depletion of first region 31 can be suppressed. Consequently, concentration of electric field at bottom portion BT of trench TR can be suppressed.

Furthermore, in the direction perpendicular to second main surface 2, fifth main surface 5 of fourth impurity region 14 is located between sixth main surface 6 of second impurity region 12 and second main surface 2. Therefore, an equipotential surface is formed between fourth impurity region 14 and first region 31. Since fourth impurity region 14 is connected to first electrode 23, the equipotential surface is closer to a potential (that is, 0 V) of first electrode 23. Consequently, concentration of electric field at bottom portion BT of trench TR can be suppressed. Therefore, breakdown of the gate insulating film can be suppressed. Therefore, reliability of the gate insulating film can be improved.

(2) In silicon carbide semiconductor device 100 according to (1), a maximum value of the impurity concentration in first region 31 may be at least ten times as large as an average value of the impurity concentration in second region 32. Thus, depletion of first region 31 in application of a reverse bias to the silicon carbide semiconductor device can further be suppressed. Consequently, concentration of electric field at bottom portion BT of trench TR can be suppressed.

(3) In silicon carbide semiconductor device 100 according to (1) or (2), first region 31 may be distant from bottom portion BT. A region where a current flows can thus be wider, and consequently an on resistance can be lowered.

(4) In silicon carbide semiconductor device 100 according to any of (1) to (3), in a direction in parallel to second main surface 2, a width of second region 32 may be equal to or greater than a width of bottom portion BT. Consequently, concentration of electric field at bottom portion BT of trench TR can be relaxed.

(5) In silicon carbide semiconductor device 100 according to (4), in the direction in parallel to second main surface 2, the width of bottom portion BT may be equal to or greater than a width of third main surface 3. A region where a current flows can thus be wider, and consequently an on resistance can be lowered.

(6) In silicon carbide semiconductor device 100 according to any of (1) to (3), in a direction in parallel to second main surface 2, a width of third main surface 3 may be equal to or smaller than a width of second region 32. A region where a current flows can thus be wider, and consequently an on resistance can be lowered.

(7) In silicon carbide semiconductor device 100 according to any of (1) to (6), an angle θ formed between side surface SW and first main surface 1 may be not smaller than 90°. Mobility in a channel region can thus be enhanced. Consequently, an on resistance can be lowered.

(8) In silicon carbide semiconductor device 100 according to any of (1) to (7), the impurity concentration in first impurity region 11 may be higher than $2\times10^{16}$ cm$^{-3}$ and lower than $1\times10^{18}$ cm$^{-3}$. A high breakdown voltage can thus be maintained while an on resistance is lowered.

(9) In silicon carbide semiconductor device 100 according to any of (1) to (8), first region 31 may be higher in impurity concentration than first impurity region 11. Thus, a depletion layer can extend to first impurity region 11 in application of a reverse bias to the silicon carbide semiconductor device. Consequently, concentration of electric field at bottom portion BT of trench TR can be suppressed.

(10) In silicon carbide semiconductor device 100 according to any of (1) to (9), first impurity region 11 may be higher in impurity concentration than fifth impurity region 15. An on resistance can thus be lowered.

(11) In silicon carbide semiconductor device 100 according to any of (1) to (10), second impurity region 12 may be higher in impurity concentration than first impurity region 11. Thus, punch-through of second impurity region 12 due to extension of a depletion layer into second impurity region 12 from a boundary between second impurity region 12 and first impurity region 11 can be suppressed.

(12) In silicon carbide semiconductor device 100 according to any of (1) to (11), in the direction perpendicular to second main surface 2, first region 31 may have a thickness not smaller than 0.1 μm. Complete depletion of first region 31 can be avoided and concentration of electric field at bottom portion BT of trench TR can further be suppressed.

(13) In silicon carbide semiconductor device 100 according to any of (1) to (12), gate insulating film 21 may include a first portion 21b in contact with side surface SW and a second portion 21c in contact with bottom portion BT. Second portion 21c is greater in thickness than first portion 21b. Breakdown of the gate insulating film can thus be suppressed even though high electric field is applied to bottom portion BT.

(14) In silicon carbide semiconductor device 100 according to any of (1) to (13), in the direction perpendicular to second main surface 2, fifth main surface 5 may be located between sixth main surface 6 and bottom portion BT. A region where a current flows can thus be wider, and consequently an on resistance can further be lowered.

(15) In silicon carbide semiconductor device 100 according to any of (1) to (13), in the direction perpendicular to second main surface 2, fifth main surface 5 may be located between bottom portion BT and third main surface 3. Concentration of electric field at bottom portion BT of trench TR can thus be suppressed while an on resistance is lowered.

(16) In silicon carbide semiconductor device 100 according to any of (1) to (13), in the direction perpendicular to second main surface 2, fifth main surface 5 may be located between third main surface 3 and a boundary surface 7 between first region 31 and second region 32. An equipotential surface is thus more readily formed between fourth impurity region 14 and first region 31. Consequently, concentration of electric field at bottom portion BT of trench TR can further be suppressed.

(17) A method of manufacturing silicon carbide semiconductor device 100 according to the present disclosure includes steps below. Silicon carbide substrate 10 including first main surface 1 and second main surface 2 opposite to first main surface 1 is prepared. Gate insulating film 21 in contact with side surface SW and bottom portion BT is formed. First electrode 23 in contact with third impurity region 13 and fourth impurity region 14 in first main surface 1 is formed. Second electrode 20 in contact with second main surface 2 is formed. Silicon carbide substrate 10 includes first impurity region 11 having a first conductivity type, second impurity region 12 which is provided on first impurity region 11 and has a second conductivity type different from the first conductivity type, third impurity region 13 which is provided on second impurity region 12 as being distant from first impurity region 11 and has the first conductivity type, fourth impurity region 14 which penetrates third impurity region 13 and second impurity region 12, is in contact with first impurity region 11, and has the second conductivity type, fifth impurity region 15 which is in contact with first impurity region 11 and located between first impurity region 11 and second main surface 2 and has the first conductivity type, and sixth impurity region 16 which is in contact with fifth impurity region 15 and has the second conductivity type. First main surface 1 is provided with trench TR defined by side surface SW which penetrates third impurity region 13 and second impurity region 12 and reaches first impurity region 11 and bottom portion BT continuous to side surface SW. Sixth impurity region 16 includes first region 31 which includes third main surface 3 facing bottom portion BT and second region 32 which is in contact with first region 31 and includes fourth main surface 4 facing second main surface 2. First region 31 is higher in impurity concentration than second region 32. Fourth impurity region 14 includes fifth main surface 5 which faces the second main surface. Second impurity region 12 includes sixth main surface 6 which faces second main surface 2. In a direction perpendicular to second main surface 2, fifth main surface 5 is located between sixth main surface 6 and second main surface 2.

According to the method of manufacturing silicon carbide semiconductor device 100 according to (17), silicon carbide substrate 10 includes fifth impurity region 15 having the first conductivity type and sixth impurity region 16 which is in contact with fifth impurity region 15 and has the second conductivity type. Fifth impurity region 15 and sixth impurity region 16 form a super junction structure in which they mutually compensate for charges. Therefore, a breakdown voltage of silicon carbide semiconductor device 100 can be improved.

Sixth impurity region 16 includes first region 31 which includes third main surface 3 facing bottom portion BT and second region 32 which is in contact with first region 31 and includes fourth main surface 4 facing second main surface 2. Thus, even when second region 32 is completely depleted in application of a reverse bias to the silicon carbide semiconductor device, complete depletion of first region 31 can be suppressed. Consequently, concentration of electric field at bottom portion BT of trench TR can be suppressed.

Furthermore, in the direction perpendicular to second main surface 2, fifth main surface 5 of fourth impurity region 14 is located between sixth main surface 6 of second impurity region 12 and second main surface 2. Therefore, an equipotential surface is formed between fourth impurity region 14 and first region 31. Since fourth impurity region 14 is connected to first electrode 23, the equipotential surface is closer to a potential (that is, 0 V) of first electrode 23. Consequently, concentration of electric field at bottom portion BT of trench TR can be suppressed. Therefore, breakdown of the gate insulating film can be suppressed. Therefore, reliability of the gate insulating film can be improved.

(18) In the method of manufacturing silicon carbide semiconductor device 100 according to (17), the preparing silicon carbide substrate 10 may include forming a first epitaxial layer 61 of the first conductivity type, forming a second epitaxial layer 62 of the first conductivity type on first epitaxial layer 61, and implanting impurity ions which can provide the first conductivity type into second epitaxial layer 62. Second epitaxial layer 62 includes a first portion 17 to be an active region and a second portion 19 which surrounds first portion 17 and becomes a termination region. In the implanting impurity ions, first impurity region 11 is formed by implanting the impurity ions into first portion 17 without implanting the impurity ions into second portion 19. An on resistance can be lowered by making an impurity concentration in first portion 17 to be an active region higher. A high breakdown voltage can be maintained by lowering an impurity concentration in second portion 19 to be a termination region.

Details of Embodiment of the Present Disclosure

An embodiment will be described below with reference to the drawings. The same or corresponding elements in the drawings below have the same reference characters allotted and description thereof will not be repeated.

A construction of a MOSFET 100 representing one example of a silicon carbide semiconductor device according to the present embodiment will initially be described.

As shown in FIG. 1, MOSFET 100 according to the present embodiment mainly includes silicon carbide substrate 10, gate insulating film 21, a gate electrode 24, an interlayer insulating film 22, a source electrode 23, and a drain electrode 20. Silicon carbide substrate 10 includes a silicon carbide single crystal substrate 50 and a silicon carbide epitaxial layer 40 on silicon carbide single crystal substrate 50. Silicon carbide substrate 10 includes first main surface 1 and second main surface 2 opposite to first main surface 1. Silicon carbide epitaxial layer 40 defines first main surface 1 and silicon carbide single crystal substrate 50 defines second main surface 2. Silicon carbide single crystal substrate 50 and silicon carbide epitaxial layer 40 are composed, for example, of hexagonal silicon carbide having a polytype of 4H. Silicon carbide single crystal substrate 50 contains an n-type impurity such as nitrogen (N) and has an n-type (a first conductivity type). A maximum diameter of first main surface 1 of the silicon carbide substrate is, for example, not smaller than 100 mm and preferably not smaller than 150 mm.

First main surface 1 is defined by a {0001} plane or a plane angled off by an off angle not greater than 8° relative to the {0001} plane in an off direction. Preferably, first main surface 1 is defined by a (000-1) plane or a plane angled off by an off angle not greater than 8° relative to the (000-1) plane in the off direction. The off direction may be, for example, a <11-20> direction or a <1-100> direction. The off angle may be, for example, not smaller than 1° or not smaller than 2°. The off angle may be not greater than 6° or not greater than 4°.

Silicon carbide epitaxial layer 40 mainly includes a current spread layer 11 (first impurity region), a body region 12 (second impurity region), a source region 13 (third impurity region), a contact region 14 (fourth impurity region), a first pillar region 15 (fifth impurity region), and a second pillar region 16 (sixth impurity region).

Current spread layer 11 contains an n-type impurity such as nitrogen and has the n conductivity type. A concentration of the n-type impurity contained in current spread layer 11 is, for example, approximately $1 \times 10^{17}$ cm$^{-3}$. A concentration of the n-type impurity in current spread layer 11 may be higher than $2 \times 10^{16}$ cm$^{-3}$ and lower than $1 \times 10^{18}$ cm$^{-3}$. A concentration of the n-type impurity in current spread layer 11 may be not lower than $3 \times 10^{16}$ cm$^{-3}$ and not lower than $5 \times 10^{16}$ cm$^{-3}$. A concentration of the n-type impurity in current spread layer 11 may be not higher than $5 \times 10^{17}$ cm$^{-3}$ and not higher than $1 \times 10^{17}$ cm$^{-3}$. Current spread layer 11 may be higher in concentration of the n-type impurity, for example, than first pillar region 15. Current spread layer 11 is located on first pillar region 15 and second pillar region 16. Current spread layer 11 has a thickness, for example, not smaller than 0.5 μm and not greater than 2.0 μm.

Body region 12 is provided on current spread layer 11. Body region 12 contains a p-type impurity such as aluminum (Al) and has the p conductivity type (second conductivity type). A concentration of the p-type impurity in body region 12 is, for example, approximately $1 \times 10^{18}$ cm$^{-3}$. A concentration of the p-type impurity in body region 12 may be not lower than $1 \times 10^{17}$ cm$^{-3}$ and not higher than $2 \times 10^{18}$ cm$^{-3}$. Body region 12 has a thickness, for example, not smaller than 0.2 μm and not greater than 1.0 μm. Preferably, a concentration of the p-type impurity in body region 12 is higher than a concentration of the n-type impurity in current spread layer 11. Preferably, a concentration of the p-type impurity in body region 12 is at least twice as high as the concentration of the n-type impurity in current spread layer 11. Body region 12 includes sixth main surface 6 which faces second main surface 2. Body region 12 is in contact with current spread layer 11 at sixth main surface 6.

Source region 13 is provided on body region 12 as being spaced apart from current spread layer 11 by body region 12. Source region 13 contains an n-type impurity such as nitrogen or phosphorus (P) and has the n conductivity type. Source region 13 defines first main surface 1. Preferably, a concentration of the n-type impurity in source region 13 is higher than a concentration of the p-type impurity in body region 12. A concentration of the n-type impurity contained in source region 13 is, for example, approximately $2 \times 10^{19}$ cm$^{-3}$. A concentration of the n-type impurity in source region 13 may be not lower than $1 \times 10^{19}$ cm$^{-3}$ and not higher than $2 \times 10^{20}$ cm$^{-3}$. Source region 13 has a thickness, for example, not smaller than 0.1 μm and not greater than 0.5 μm.

Contact region 14 contains a p-type impurity such as aluminum and has the p conductivity type. Contact region 14 is higher in concentration of the p-type impurity, for example, than body region 12. Contact region 14 penetrates source region 13 and body region 12 and is in contact with current spread layer 11. Contact region 14 includes fifth main surface 5 which faces second main surface 2. Contact region 14 defines first main surface 1. A concentration of the p-type impurity in contact region 14 is, for example, not lower than $1 \times 10^{18}$ cm$^{-3}$ and not higher than $3 \times 10^{20}$ cm$^{-3}$.

Contact region 14 may be higher in concentration of the p-type impurity at first main surface 1, for example, than at fifth main surface 5. A concentration of the p-type impurity in contact region 14 at first main surface 1 is, for example, approximately $1 \times 10^{20}$ cm$^{-3}$. A concentration of the p-type impurity in contact region 14 at fifth main surface 5 is, for example, approximately $1 \times 10^{18}$ cm$^{-3}$. In the direction perpendicular to second main surface 2, fifth main surface 5 is located between sixth main surface 6 and second main surface 2. Specifically, in the direction perpendicular to second main surface 2, fifth main surface 5 is located, for example, between sixth main surface 6 and bottom portion BT.

First pillar region 15 is in contact with current spread layer 11. First pillar region 15 contains an n-type impurity such as nitrogen and has the n conductivity type. First pillar region 15 is located between current spread layer 11 and second main surface 2. A concentration of the n-type impurity in first pillar region 15 is, for example, approximately $3 \times 10^{16}$ cm$^{-3}$. First pillar region 15 is lower in concentration of the n-type impurity than silicon carbide single crystal substrate 50.

Second pillar region 16 is in contact with first pillar region 15. Second pillar region 16 contains a p-type impurity such as aluminum and has the p conductivity type. A concentration of the p-type impurity in second pillar region 16 is, for example, approximately $3 \times 10^{16}$ cm$^{-3}$. First pillar region 15 and second pillar region 16 are alternately and repeatedly arranged in a direction in parallel to second main surface 2. First pillar region 15 and second pillar region 16 form a super junction structure. A total value of a width W4 of first pillar region 15 and a width W3 of second pillar region 16 defines a cell pitch CP. When first pillar region 15 has width W4 of 5 μm and second pillar region 16 has width W3 of 2 μm, cell pitch CP is 7 μm. Cell pitch CP is, for example, not smaller than 3 μm and not greater than 10 μm. Second pillar region 16 has width W3, for example, not lower than 20% and not higher than 80% of cell pitch CP.

Trench TR defined by side surface SW and bottom portion BT is provided in first main surface 1. Side surface SW penetrates source region 13 and body region 12 and reaches current spread layer 11. Bottom portion BT is continuous to side surface SW. Bottom portion BT is located in current spread layer 11. Bottom portion BT is a plane, for example, in parallel to second main surface 2. Angle θ formed between side surface SW and first main surface 1 is, for example, 90°. Angle θ may be not smaller than 90°. Trenches TR extend in stripes, for example, along the direction in parallel to second main surface 2. Side surface SW is defined, for example, by a {11-20} plane (that is, an a plane) or a {1-100} plane (that is, an m plane). Trenches TR may extend like a honeycomb or may be scattered like islands. Trench TR has a depth, for example, not smaller than 0.5 μm and not greater than 2.0 μm.

Second pillar region 16 includes first region 31 and second region 32. First region 31 includes third main surface 3 which faces bottom portion BT. Second region 32 is in contact with first region 31. Second region 32 includes fourth main surface 4 which faces second main surface 2. Second region 32 is located between first region 31 and second main surface 2. First region 31 is higher in concentration of the p-type impurity than second region 32. Second pillar region 16 is identical in direction of extension to bottom portion BT of trench TR. Preferably, second pillar region 16 faces the entire bottom portion BT of trench TR.

Figure 2:
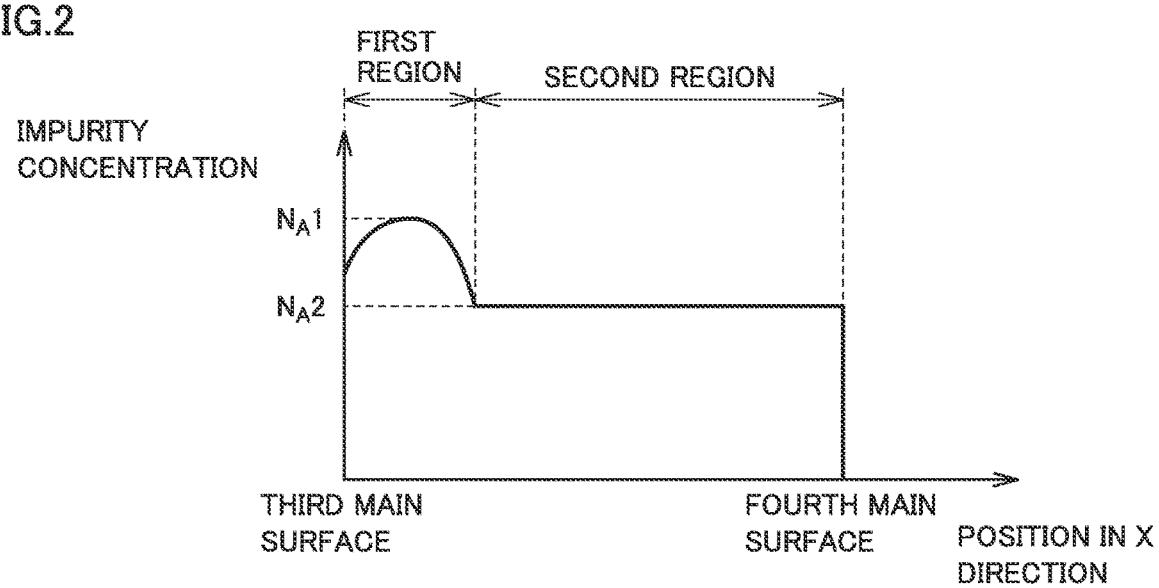
FIG. 2 is a diagram showing a distribution of an impurity concentration in a second pillar region.

As shown in FIG. 2, in a direction X perpendicular to second main surface 2, a concentration of a p-type impurity in first region 31 may be varied. For example, first region 31 includes a region where a concentration of the p-type impurity increases, a position where a maximum value is exhibited, and a region where a concentration of the p-type impurity decreases, from third main surface 3 toward fourth main surface 4. A position in first region 31 where a concentration of the p-type impurity exhibits the maximum value is located, for example, between third main surface 3 and boundary surface 7 (see FIG. 1) between first region 31 and second region 32. As shown in FIG. 2, in direction X perpendicular to second main surface 2, a concentration of the p-type impurity in second region 32 may be constant. A maximum value $N_A1$ of the concentration of the p-type impurity in first region 31 is, for example, at least ten times, preferably at least twenty times, and more preferably at least fifty times as high as an average value $N_A2$ of the concentration of the p-type impurity in second region 32. A concentration of the p-type impurity in first region 31 may be higher than a concentration of the n-type impurity in current spread layer 11.

As shown in FIG. 1, first region 31 may be distant from bottom portion BT. In direction X perpendicular to second main surface 2, a distance H3 between first region 31 and bottom portion BT is, for example, not smaller than 0.1 μm and not greater than 1 μm. In direction X perpendicular to second main surface 2, a thickness H1 of first region 31 is, for example, not smaller than 0.1 μm, preferably not smaller than 0.13 μm, and more preferably not smaller than 0.2 μm. First region 31 has thickness H1, for example, not greater than 1 μm. Typically, in direction X perpendicular to second main surface 2, a thickness H2 of second region 32 is greater than thickness H1 of first region 31. Second region 32 has thickness H2, for example, not smaller than 3 μm and not greater than 7 μm. When specifications for a breakdown voltage are defined as 1200 V, second region 32 has thickness H2, for example, not smaller than 5 μm and not greater than 7 μm. When specifications for a breakdown voltage are defined as 600 V, second region 32 has thickness H2, for example, not smaller than 3 μm and not greater than 5 μm.

In a direction Y in parallel to second main surface 2, width W3 of second region 32 may be, for example, equal to or greater than a width W1 of bottom portion BT. Second region 32 has width W3, for example, not smaller than 2 μm and not greater than 3 μm. In direction Y in parallel to second main surface 2, width W1 of bottom portion BT may be equal to or greater than a width of third main surface 3. In MOSFET 100 according to the present embodiment, width W1 of bottom portion BT is substantially the same as the width of first region 31. A width W2 of first region 31 is substantially the same as width W3 of second region 32.

As shown in FIG. 1, gate insulating film 21 is in contact with side surface SW and bottom portion BT. Gate insulating film 21 includes, for example, first portion 21b in contact with side surface SW, second portion 21c in contact with bottom portion BT, and a third portion 21a in contact with first main surface 1. Preferably, second portion 21c is greater in thickness than first portion 21b. A thickness of first portion 21b refers to a thickness of first portion 21b in a direction perpendicular to side surface SW. A thickness of second portion 21c refers to a thickness of second portion 21c in a direction perpendicular to bottom portion BT. Preferably, a thickness of second portion 21c is at least 1.5 time and at most 20 times as large as a thickness of first portion 21b.

Gate insulating film 21 is made, for example, of an oxide film. Gate insulating film 21 is composed of a material containing, for example, silicon dioxide. Second portion 21c is in contact with current spread layer 11 at bottom portion BT. First portion 21b is in contact with each of source region 13, body region 12, and current spread layer 11 at side surface SW. Third portion 21a may be in contact with source region 13 at first main surface 1.

Gate electrode 24 is provided on gate insulating film 21. Gate electrode 24 is composed of polysilicon containing, for example, a conductive impurity. Gate electrode 24 may be in contact with first portion 21b, second portion 21c, and third portion 21a of gate insulating film 21. Gate electrode 24 is arranged in trench TR.

Source electrode 23 is provided on first main surface 1. Source electrode 23 is in contact with source region 13 and contact region 14 at first main surface 1. Source electrode 23 is composed of a material containing, for example, Ti, Al, and Si. Source electrode 23 is in ohmic contact with source region 13. Preferably, source electrode 23 is in ohmic contact with contact region 14.

Drain electrode 20 is in contact with second main surface 2. Drain electrode 20 is in contact with silicon carbide single crystal substrate 50 at second main surface 2. Drain electrode 20 is electrically connected to first pillar region 15. Drain electrode 20 is composed of a material containing, for example, NiSi or TiAlSi.

Interlayer insulating film 22 is provided as being in contact with gate electrode 24 and gate insulating film 21. Interlayer insulating film 22 is composed of a material containing, for example, silicon dioxide. Interlayer insulating film 22 electrically isolates gate electrode 24 and source electrode 23 from each other. A part of interlayer insulating film 22 may be provided in trench TR.

A construction of a MOSFET according to a first modification will now be described.

Figure 3:
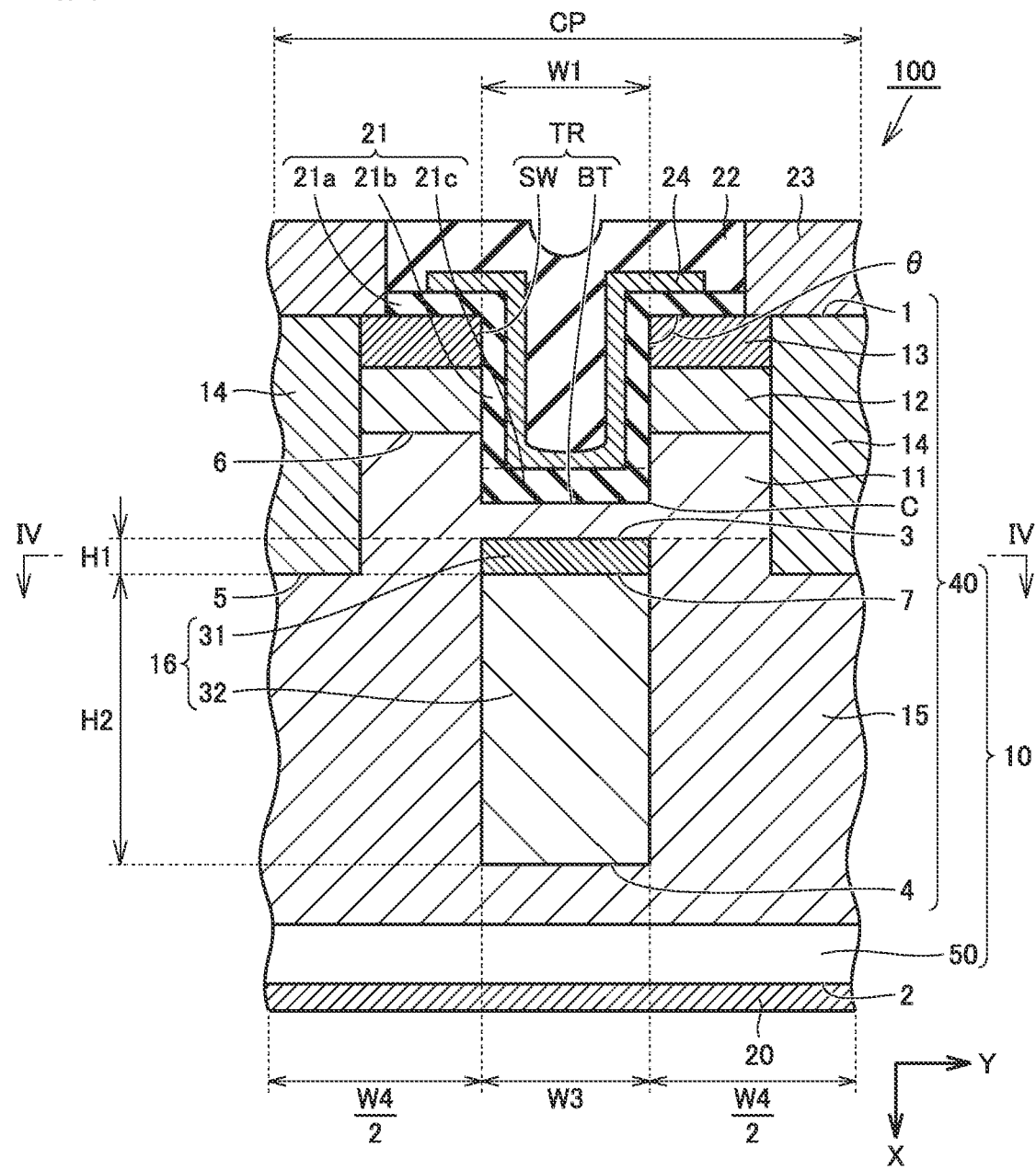
FIG. 3 is a schematic cross-sectional view along the line III-III in FIG. 4, which shows a construction in a first modification of the silicon carbide semiconductor device according to the present embodiment.
Figure 4:
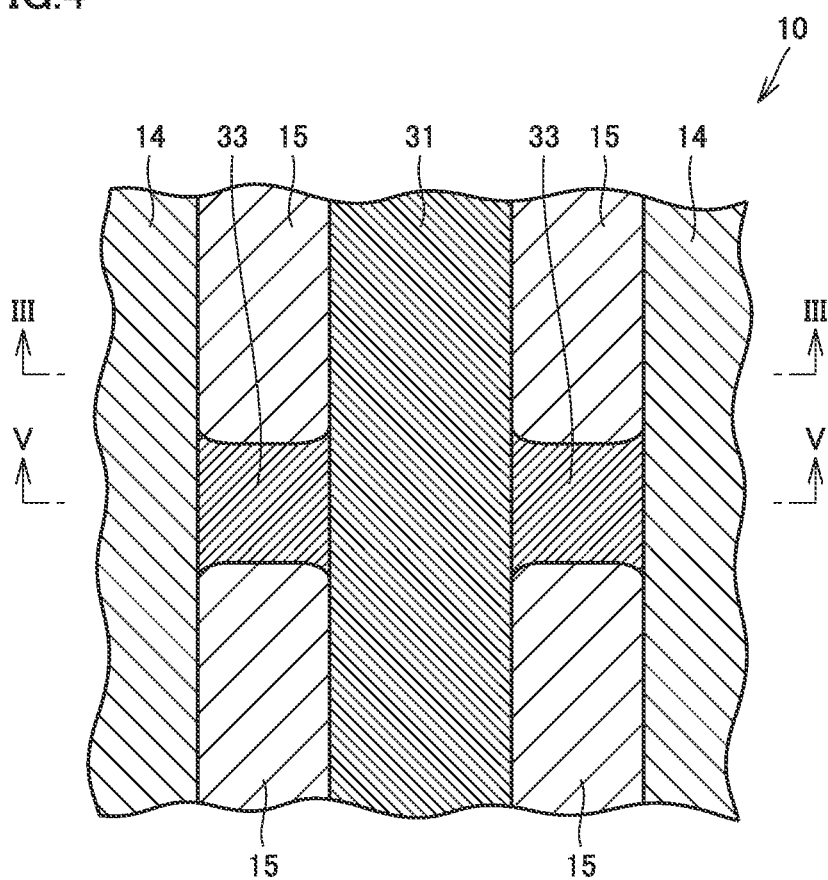
FIG. 4 is a schematic cross-sectional view along the line IV-IV in FIG. 3.
Figure 5:
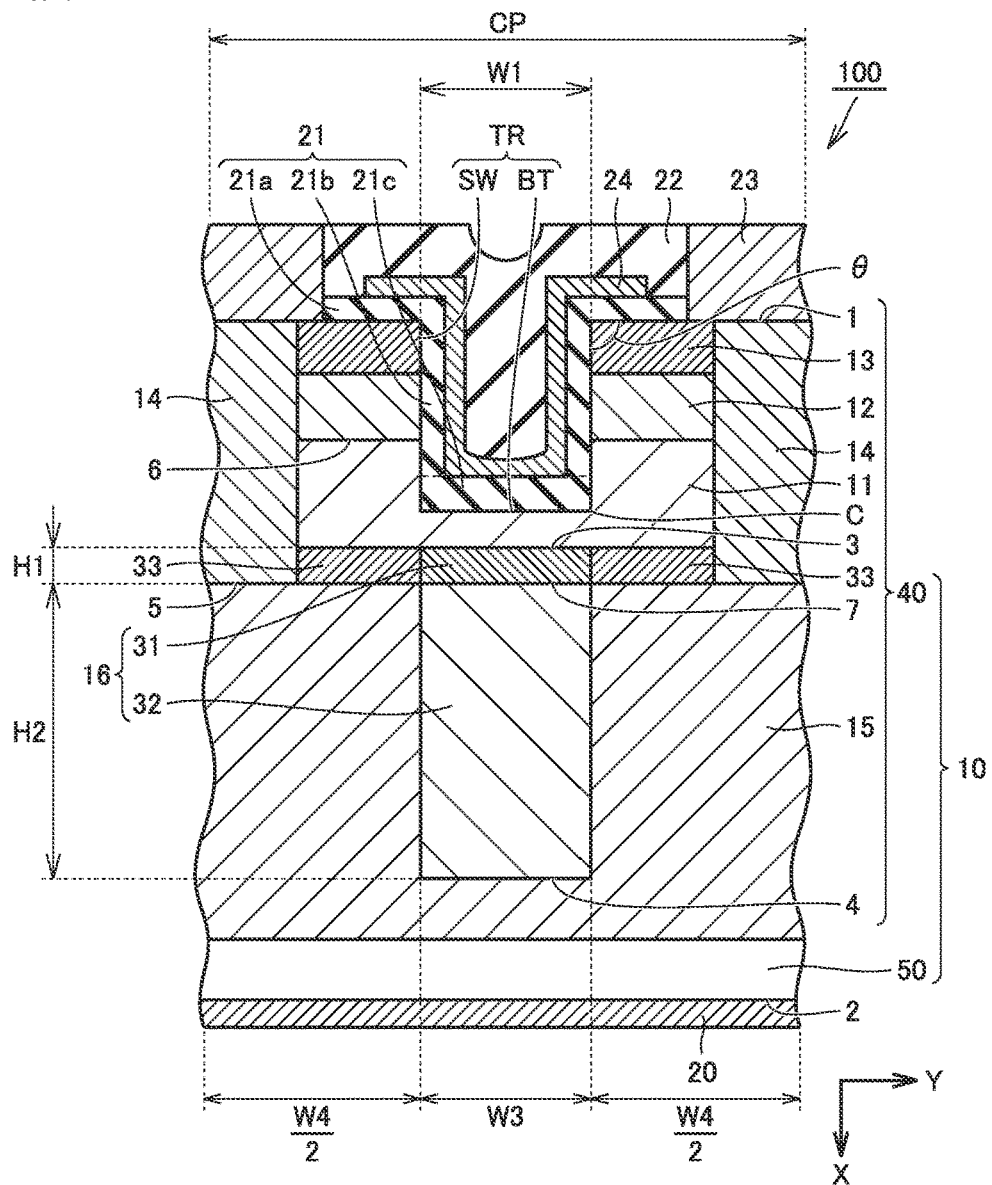
FIG. 5 is a schematic cross-sectional view along the line V-V in FIG. 4.

As shown in FIG. 3, in direction X perpendicular to second main surface 2, fifth main surface 5 of contact region 14 may be flush with boundary surface 7 between first region 31 and second region 32. As shown in FIGS. 4 and 5, contact region 14 may electrically be connected to first region 31 through a connection portion 33. Connection portion 33 contains a p-type impurity such as aluminum and has the p conductivity type. Connection portion 33 is identical in conductivity type to contact region 14 and first region 31. Connection portion 33 may be equal in concentration of the p-type impurity to first region 31.

As shown in FIG. 4, a longitudinal direction (direction of extension) of first region 31 may be the same as a longitudinal direction (direction of extension) of contact region 14. First region 31 is provided along bottom portion BT. When viewed in direction X perpendicular to second main surface 2, bottom portion BT is superimposed on first region 31. Connection portion 33 is in contact with first pillar region 15 at one end surface and the other end surface in the longitudinal direction of first region 31. In other words, when viewed in direction X perpendicular to second main surface 2, connection portion 33 lies between first pillar regions 15.

As shown in FIG. 5, connection portion 33 is in contact with current spread layer 11 at one end surface in the direction perpendicular to second main surface 2 and is in contact with first pillar region 15 at the other end surface. In other words, when viewed in a direction perpendicular to both of direction X perpendicular to second main surface 2 and direction Y in parallel to second main surface 2 (which is also referred to as a cross-sectional view below), connection portion 33 lies between current spread layer 11 and first pillar region 15. Connection portion 33 faces body region 12. Current spread layer 11 lies between body region 12 and connection portion 33.

A construction of a MOSFET according to a second modification will now be described.

Figure 6:
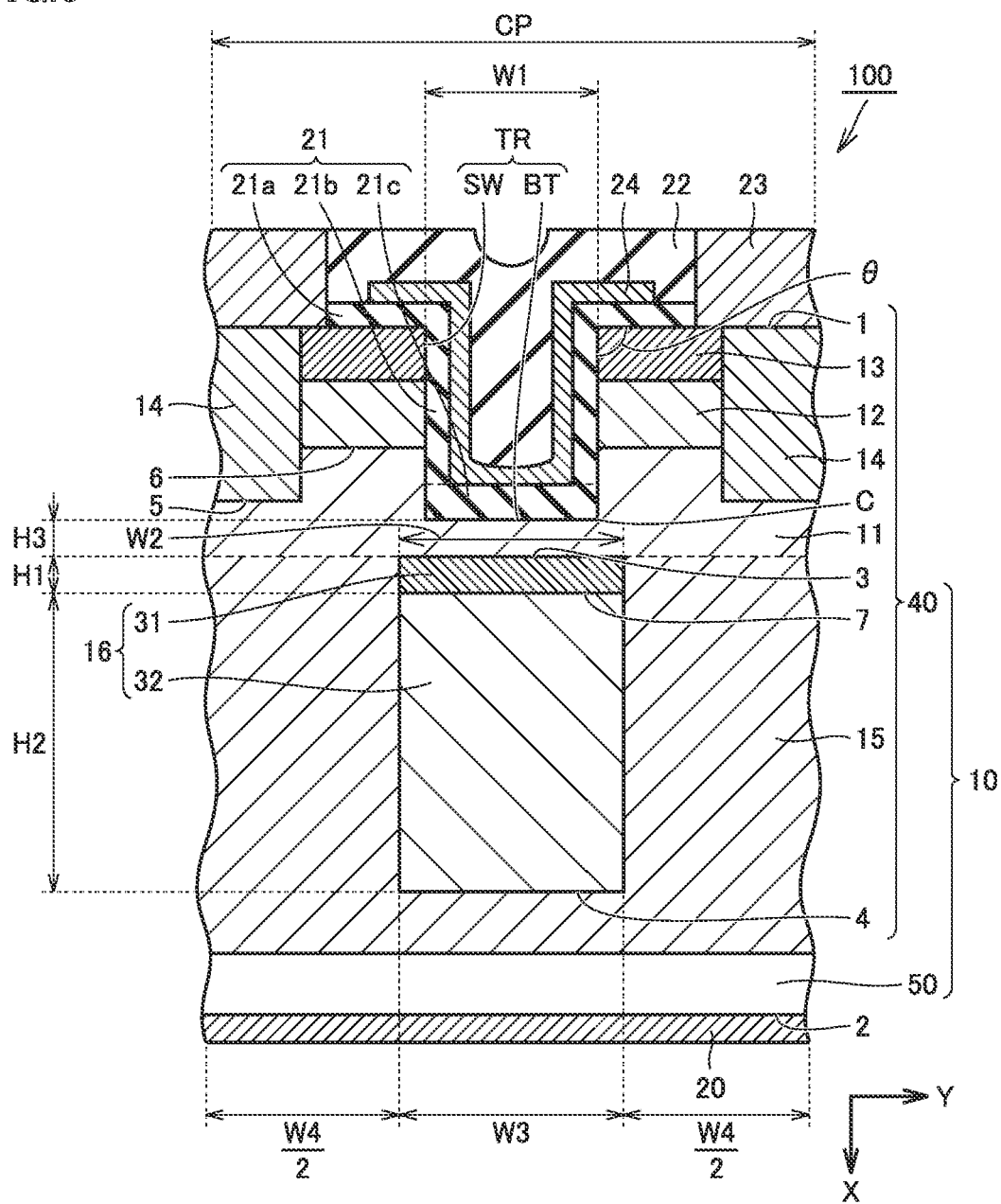
FIG. 6 is a schematic cross-sectional view showing a construction in a second modification of the silicon carbide semiconductor device according to the present embodiment.

As shown in FIG. 6, width W2 of third main surface 3 of first region 31 may be greater than width W1 of bottom portion BT. Similarly, width W3 of second region 32 may be greater than width W1 of bottom portion BT. In direction Y in parallel to second main surface 2, a side portion of first region 31 is located between side surface SW of trench TR and a side portion of contact region 14. A part of first region 31 faces body region 12. When viewed in the direction perpendicular to second main surface 2, first region 31 and second region 32 overlap with body region 12.

A construction of a MOSFET according to a third modification will now be described.

Figure 7:
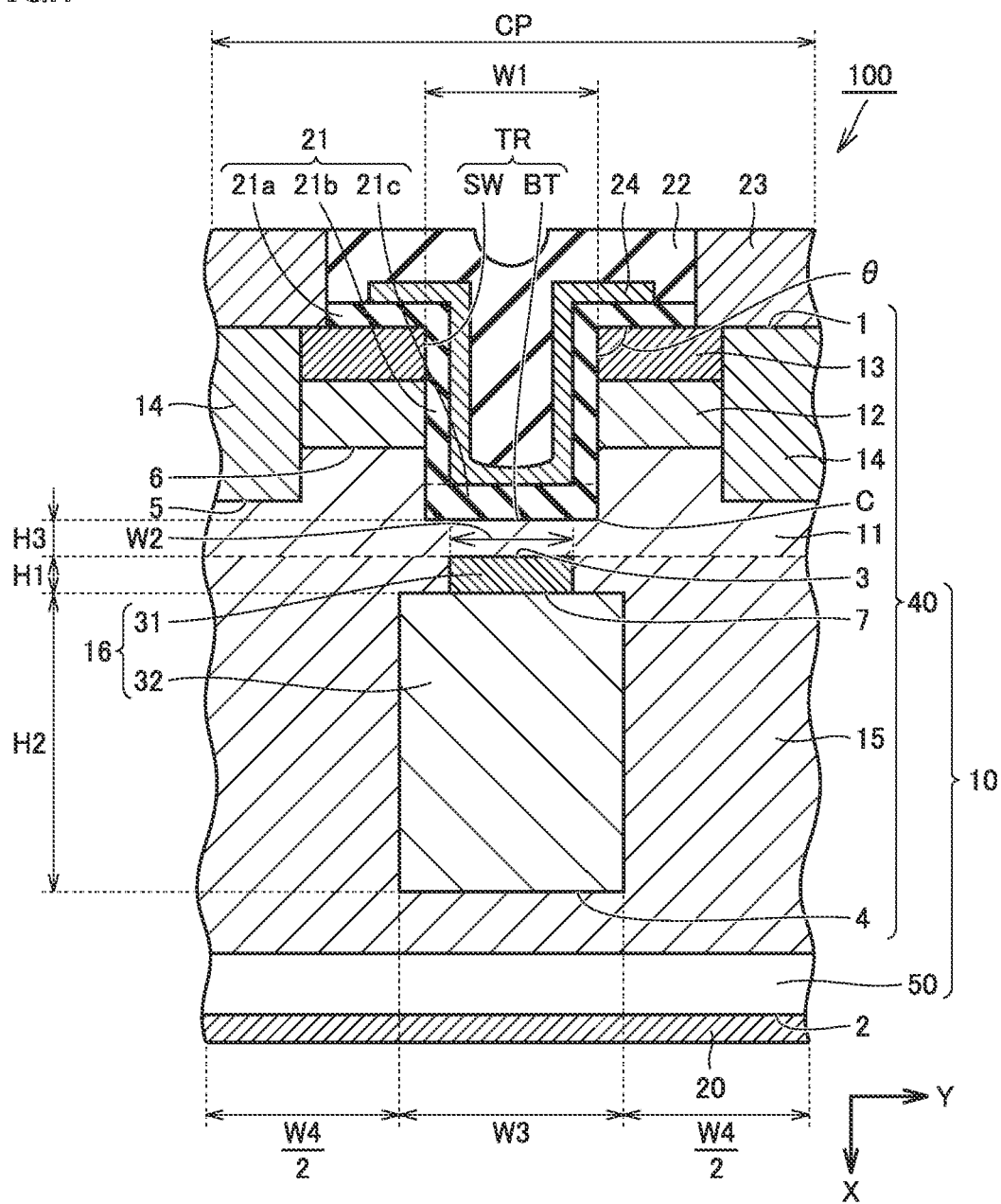
FIG. 7 is a schematic cross-sectional view showing a construction in a third modification of the silicon carbide semiconductor device according to the present embodiment.

As shown in FIG. 7, in direction Y in parallel to second main surface 2, width W2 of third main surface 3 of first region 31 may be smaller than width W1 of bottom portion BT. In direction Y in parallel to second main surface 2, width W2 of third main surface 3 of first region 31 may be equal to or smaller than width W3 of second region 32. Width W3 of second region 32 is greater than width W1 of bottom portion BT. In direction Y in parallel to second main surface 2, side surface SW of trench TR is located between a side portion of first region 31 and a side portion of second region 32. A part of second region 32 faces body region 12 and bottom portion BT. When viewed in the direction perpendicular to second main surface 2, first region 31 may be accommodated in bottom portion BT.

A construction of a MOSFET according to a fourth modification will now be described.

Figure 8:
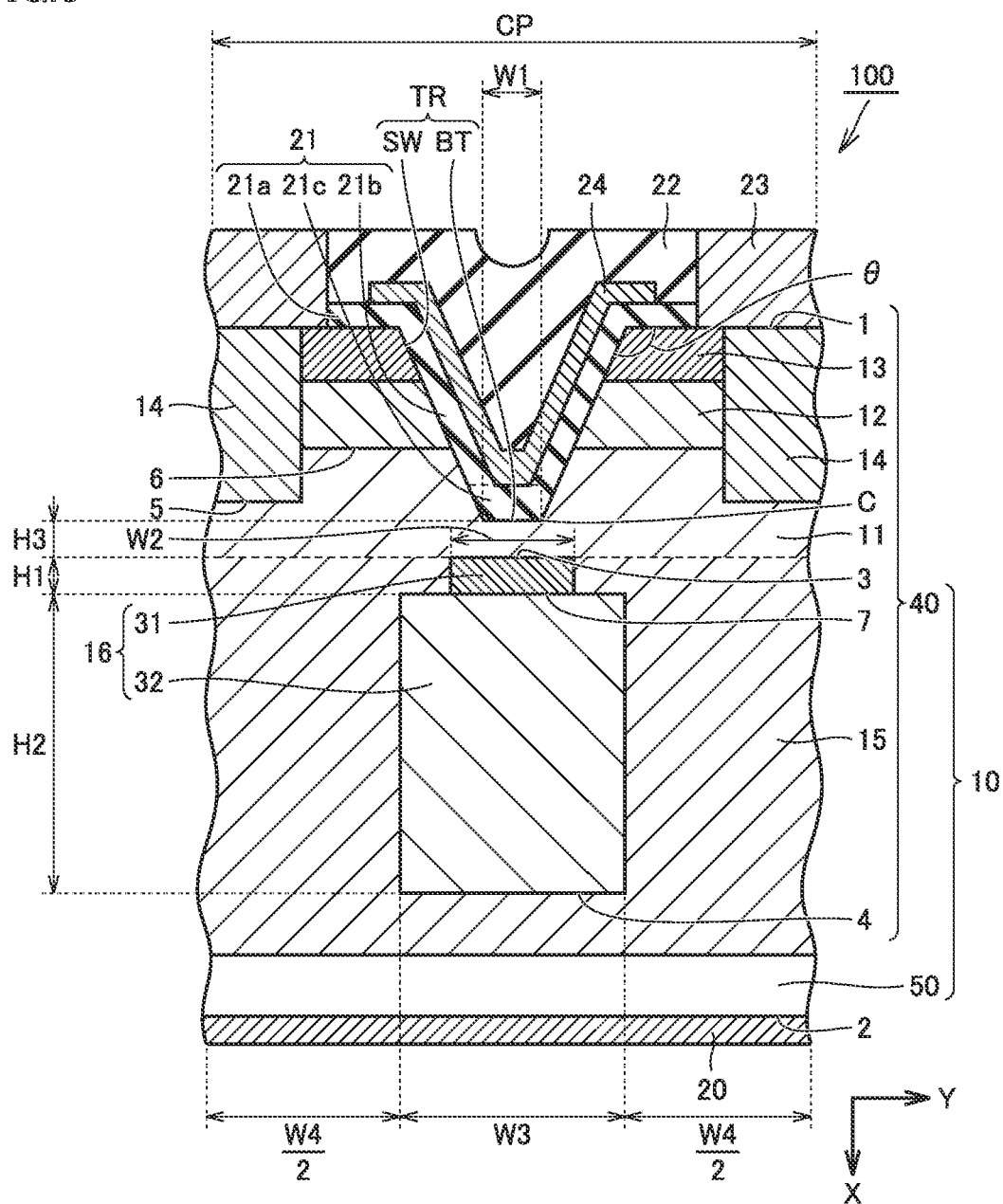
FIG. 8 is a schematic cross-sectional view showing a construction in a fourth modification of the silicon carbide semiconductor device according to the present embodiment.

As shown in FIG. 8, angle θ between side surface SW of trench TR and first main surface 1 may be greater than 90°. Side surface SW may be inclined, for example, by at least 50° and at most 70° relative to the {0001} plane. Specifically, side surface SW is inclined by at least 50° and at most 70° relative to the (000-1) plane. Mobility in a channel region can thus be enhanced. Side surface SW may include, for example, a (0-33-8) plane. Trench TR increases in width from second main surface 2 toward first main surface 1. First region 31 faces both of bottom portion BT and side surface SW. In other words, in the direction perpendicular to second main surface 2, bottom portion BT and side surface SW are superimposed on first region 31.

A construction of a MOSFET according to a fifth modification will now be described.

Figure 9:
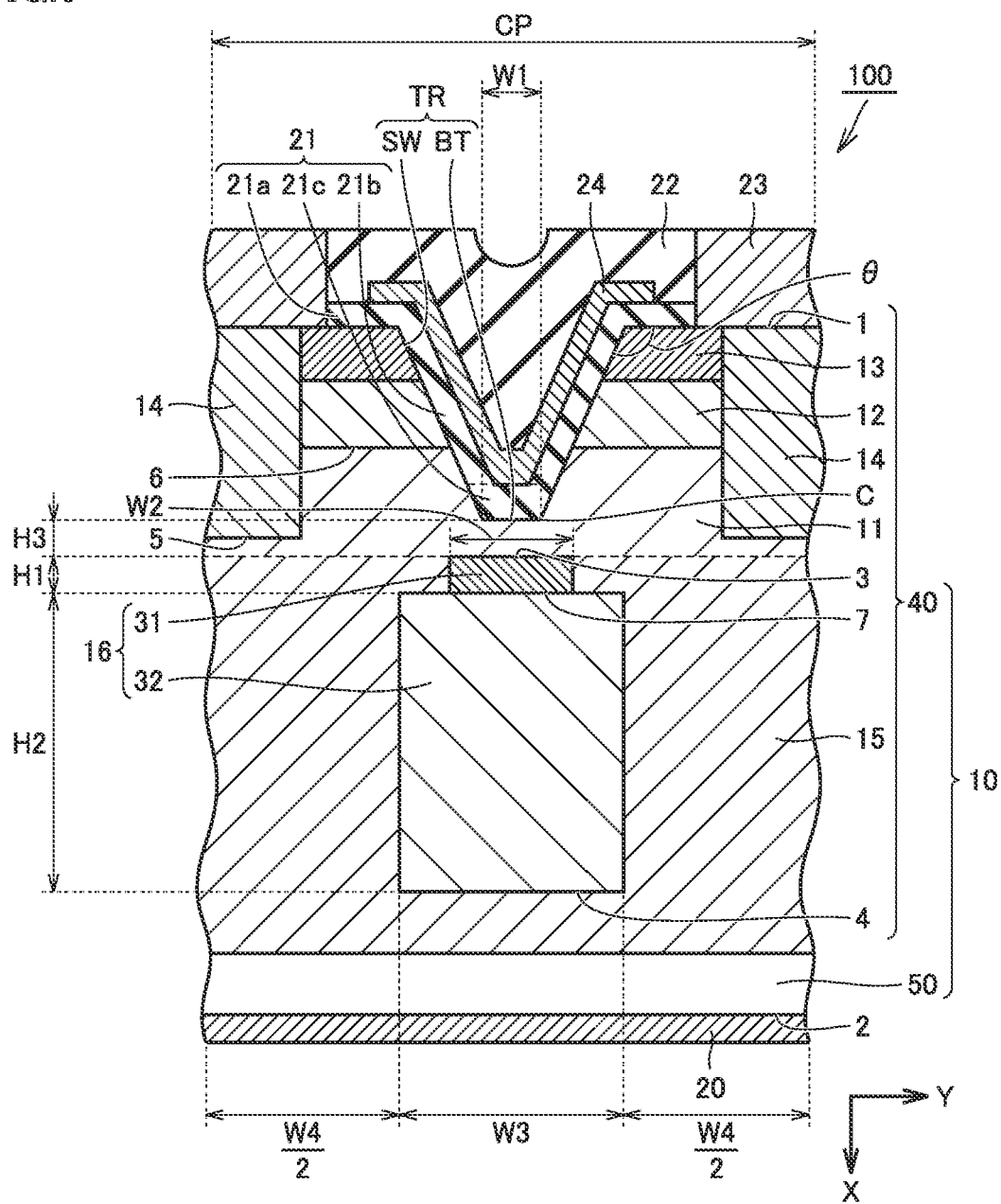
FIG. 9 is a schematic cross-sectional view showing a construction in a fifth modification of the silicon carbide semiconductor device according to the present embodiment.

As shown in FIG. 9, in the direction perpendicular to second main surface 2, fifth main surface 5 of contact region 14 may be located between bottom portion BT and third main surface 3. In other words, fifth main surface 5 is located on a side of second main surface 2 relative to bottom portion BT and located on a side of first main surface 1 relative to third main surface 3. A side surface of contact region 14 faces a corner portion C of trench TR.

A construction of a MOSFET according to a sixth modification will now be described.

Figure 10:
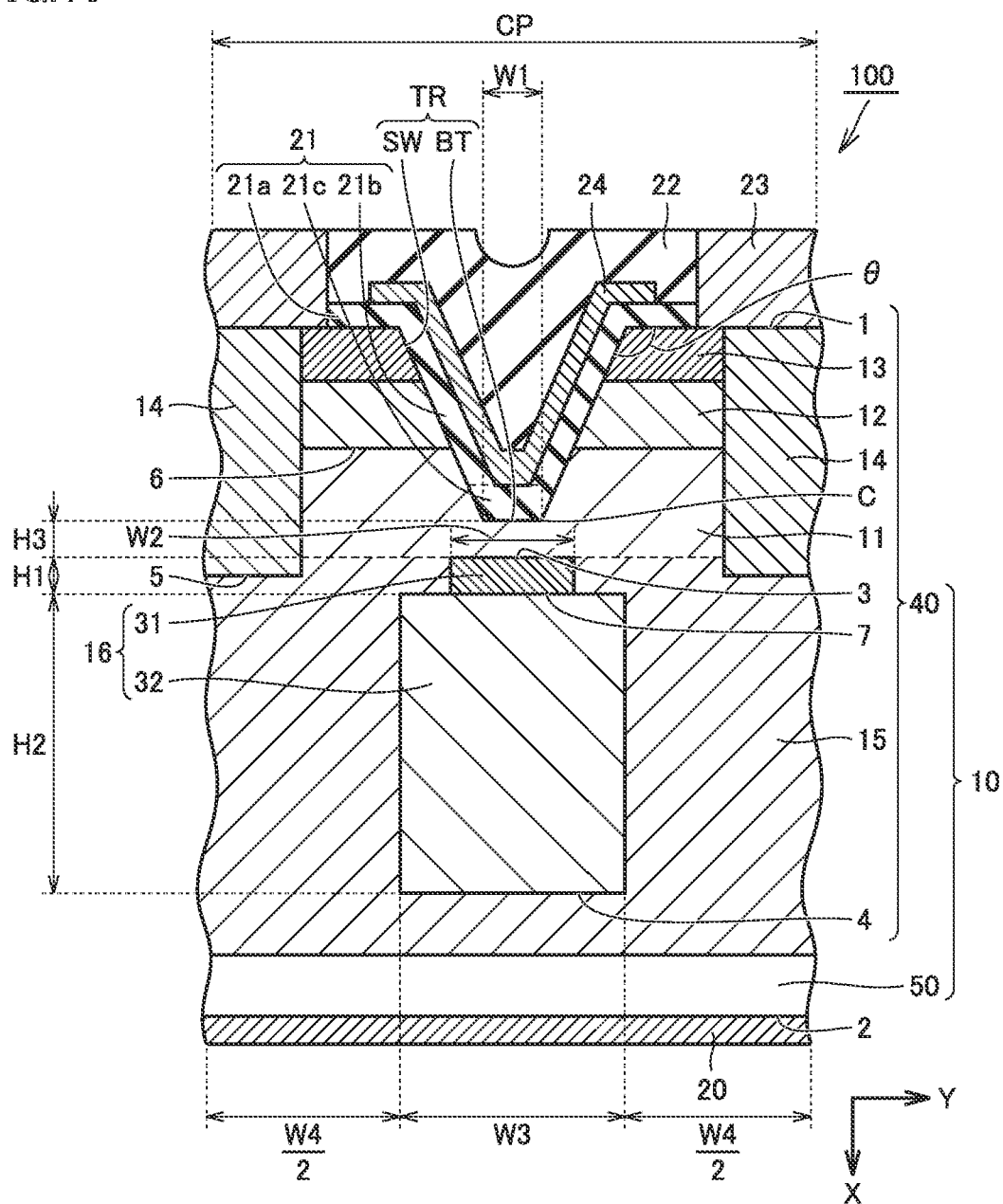
FIG. 10 is a schematic cross-sectional view showing a construction in a sixth modification of the silicon carbide semiconductor device according to the present embodiment.

As shown in FIG. 10, in the direction perpendicular to second main surface 2, fifth main surface 5 may be located between third main surface 3 and boundary surface 7 between first region 31 and second region 32. In other words, fifth main surface 5 is located on a side of second main surface 2 relative to third main surface 3 and on a side of first main surface 1 relative to boundary surface 7. A side surface of contact region 14 faces corner portion C of trench TR and a side surface of first region 31. The side surface of contact region 14 is in contact with current spread layer 11 and first pillar region 15. Fifth main surface 5 is in contact with first pillar region 15.

A construction of a MOSFET according to a seventh modification will now be described.

Figure 11:
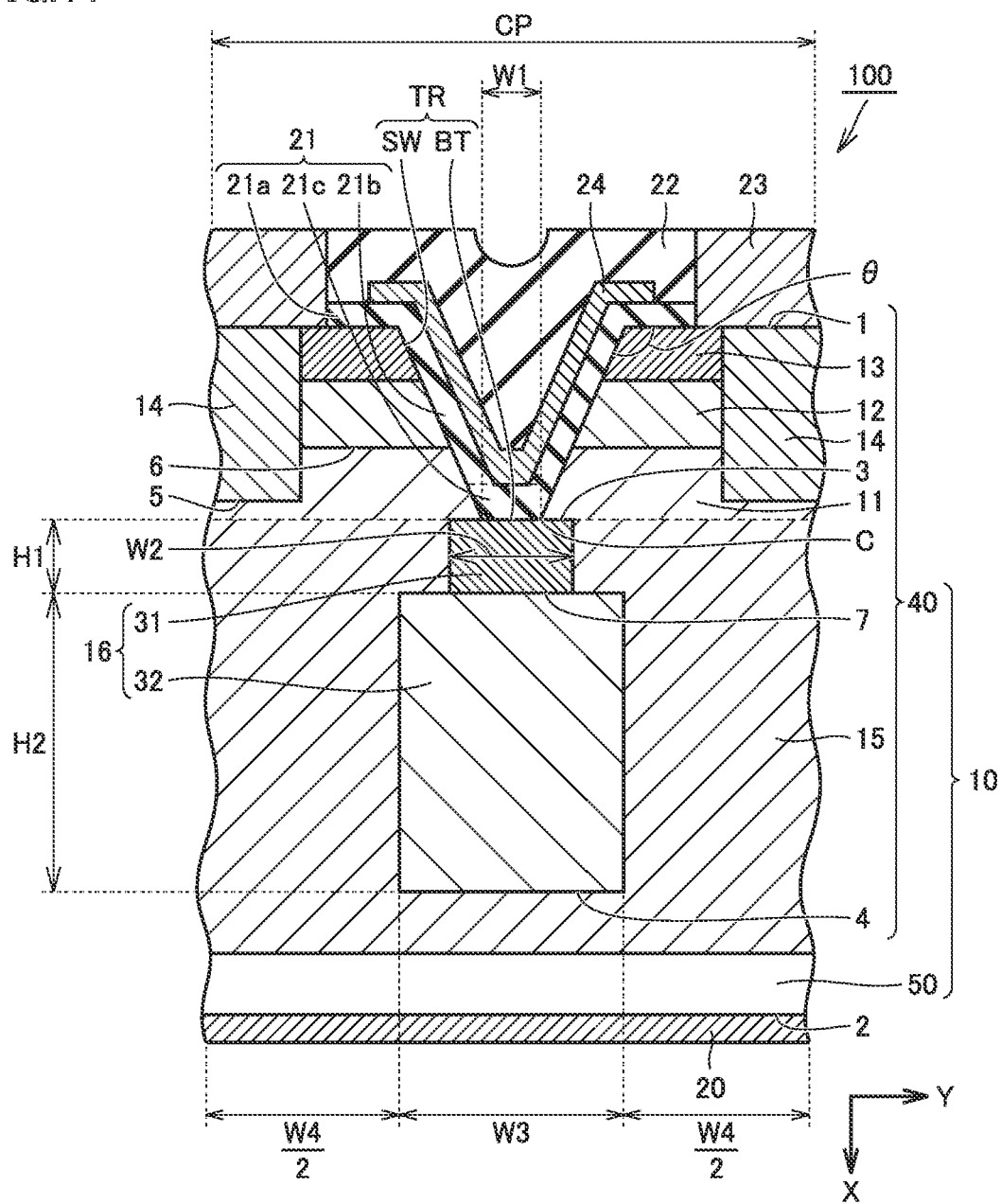
FIG. 11 is a schematic cross-sectional view showing a construction in a seventh modification of the silicon carbide semiconductor device according to the present embodiment.

As shown in FIG. 11, first region 31 may be in contact with bottom portion BT of trench TR. First region 31 may be in contact with a part or the entirety of bottom portion BT. Width W2 of first region 31 may be greater than, smaller than, or equal to width W1 of bottom portion BT. Contact of first region 31 with bottom portion BT can effectively suppress concentration of electric field at bottom portion BT of trench TR.

Figure 12:
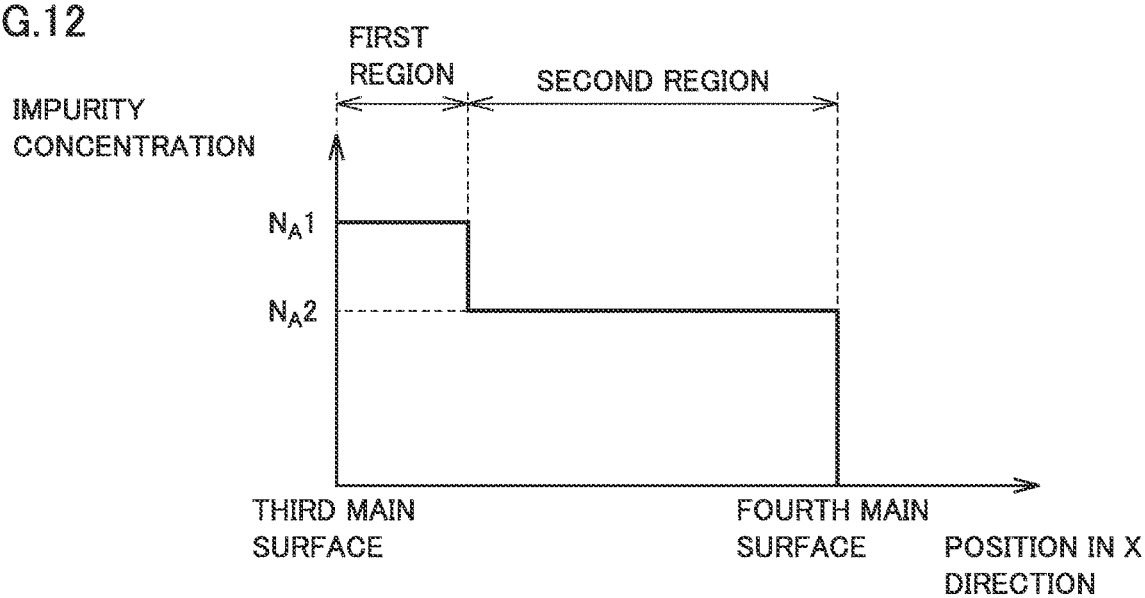
FIG. 12 is a diagram showing a modification of a distribution of an impurity concentration in the second pillar region.

As shown in FIG. 12, a concentration of a p-type impurity in first region 31 may be substantially constant from third main surface 3 toward fourth main surface 4. For example, when first region 31 is formed through epitaxial growth, a concentration of the p-type impurity in first region 31 is substantially constant. Average value $N_A 1$ of the concentration of the p-type impurity in first region 31 is smaller than average value $N_A 2$ of the concentration of the p-type impurity in second region 32.

A concentration of a p-type impurity and a concentration of an n-type impurity in each impurity region can be measured, for example, with a scanning capacitance microscope (SCM) or secondary ion mass spectrometry (SIMS). Third main surface 3, fourth main surface 4, fifth main surface 5, and sixth main surface 6 are each a boundary surface between the p-type region and the n-type region. A position of the boundary surface between the p-type region and the n-type region can be specified, for example, with SIMS.

A method of manufacturing MOSFET 100 according to the present embodiment will now be described.

Figure 13:
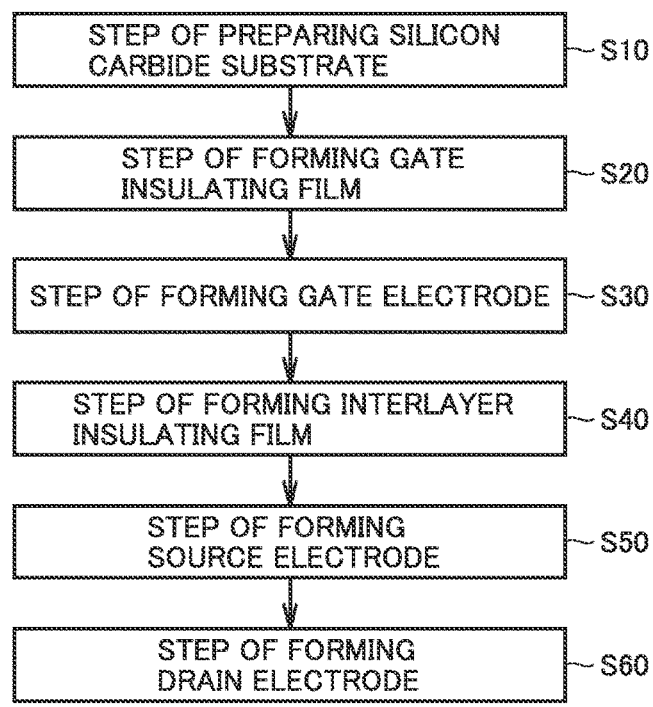
FIG. 13 is a flowchart schematically showing a method of manufacturing a silicon carbide semiconductor device according to the present embodiment.
Figure 14:
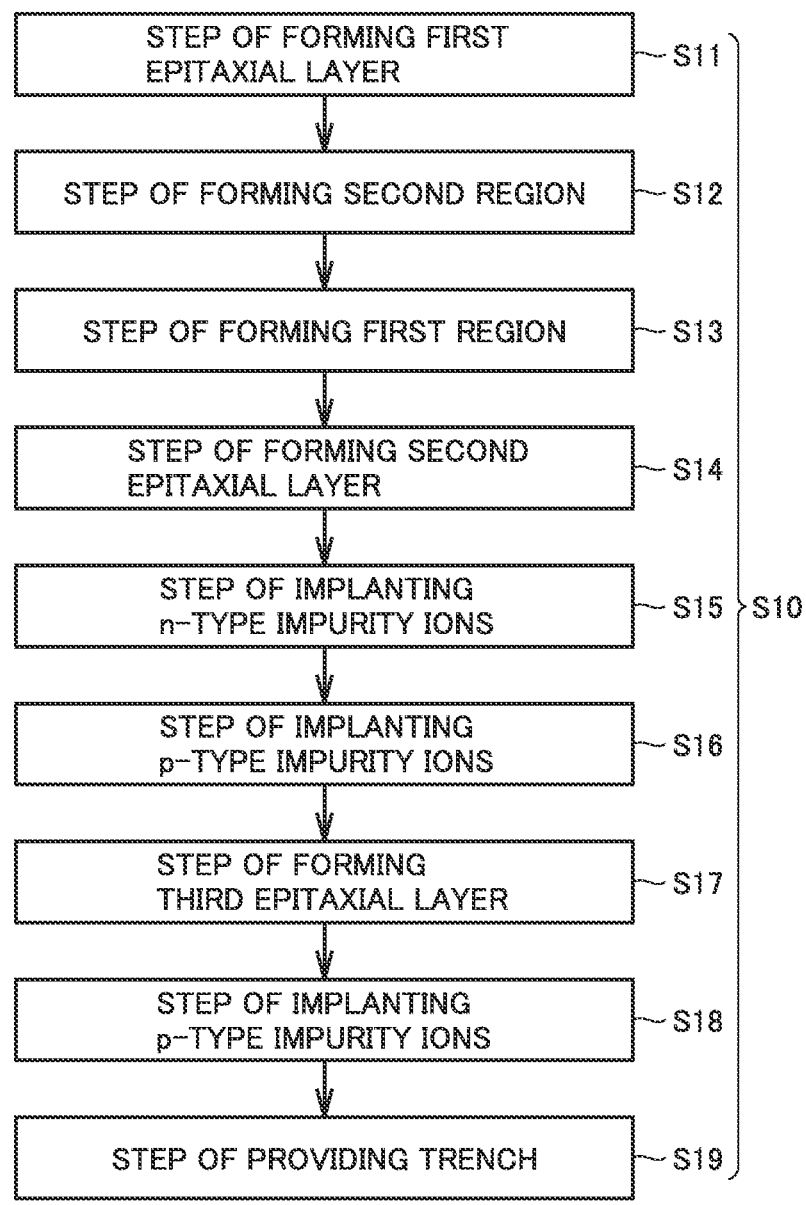
FIG. 14 is a flowchart schematically showing steps included in a step of preparing a silicon carbide substrate.
Figure 15:
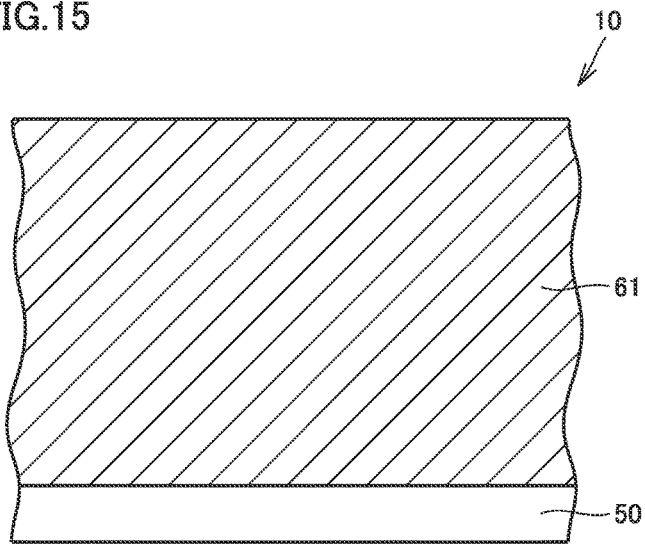
FIG. 15 is a schematic cross-sectional view showing a first step in the method of manufacturing a silicon carbide semiconductor device according to the present embodiment.

Initially, a step of preparing a silicon carbide substrate (S10: FIG. 13) is performed. For example, silicon carbide single crystal substrate 50 is prepared by slicing a silicon carbide ingot (not shown) manufactured with a sublimation method. Then, a step of forming first epitaxial layer 61 (S11: FIG. 14) is performed. First epitaxial layer 61 is formed on silicon carbide single crystal substrate 50 (see FIG. 15) with chemical vapor deposition (CVD) using, for example, a gas mixture of silane ($SiH_4$) and propane ($C_3H_8$) as source material gas and using, for example, hydrogen ($H_2$) as carrier gas. In epitaxial growth, an n-type impurity such as nitrogen is introduced in first epitaxial layer 61. First epitaxial layer 61 has the n conductivity type. First epitaxial layer 61 is lower in concentration of the n-type impurity than silicon carbide single crystal substrate 50.

Figure 16:
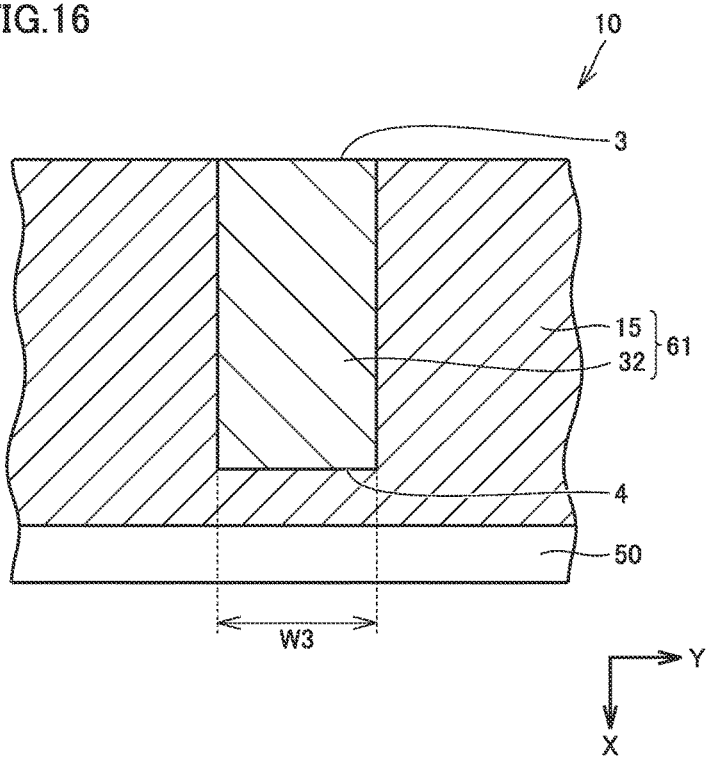
FIG. 16 is a schematic cross-sectional view showing a second step in the method of manufacturing a silicon carbide semiconductor device according to the present embodiment.

Then, a step of forming a second region (S12: FIG. 14) is performed. For example, a recess is provided in a surface of first epitaxial layer 61 with reactive ion etching (RIE). Then, a p-type epitaxial layer is formed in the recess provided in first epitaxial layer 61 (see FIG. 16) with CVD using, for example, a gas mixture of silane and propane as source material gas and using, for example, hydrogen as carrier gas. In epitaxial growth, a p-type impurity such as aluminum is introduced into the p-type epitaxial layer. Second region 32 is thus formed. Second region 32 has width W3, for example, not smaller than 2 μm and not greater than 3 μm. Instead of forming a p-type epitaxial layer, second region 32 may be formed by implanting such p-type impurity ions as aluminum ions into first epitaxial layer 61.

Figure 17:
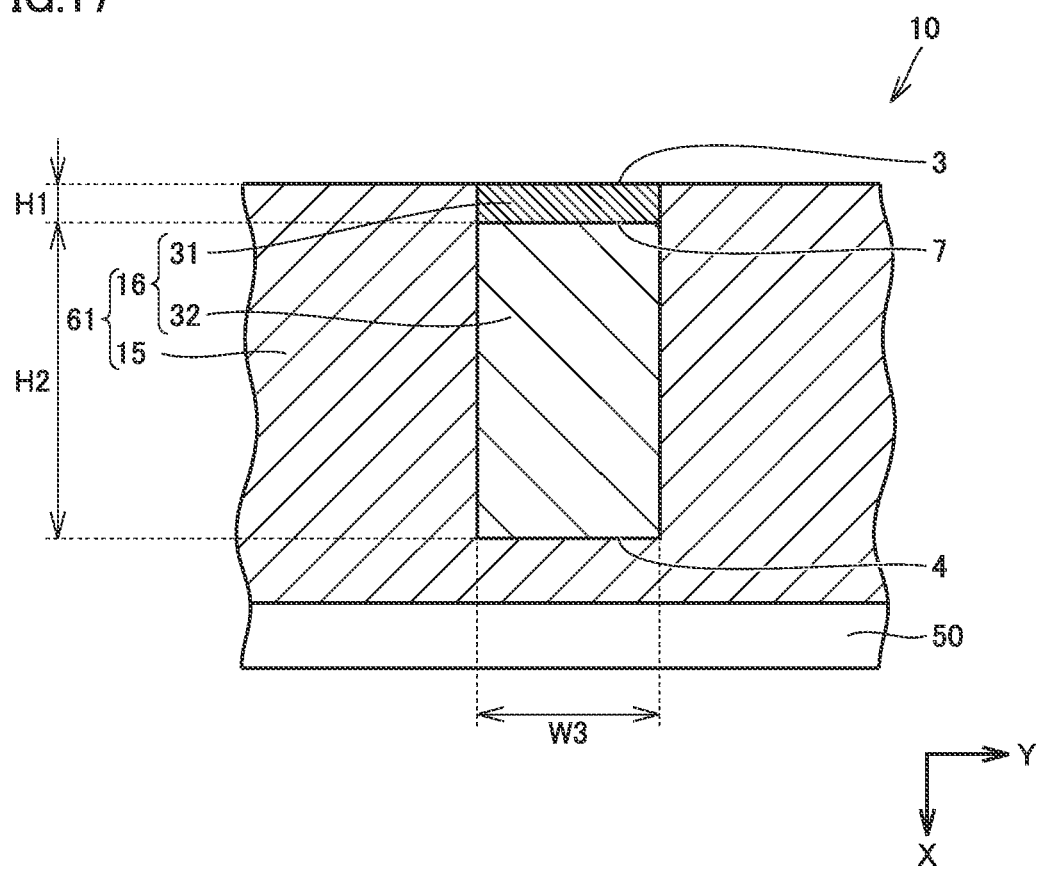
FIG. 17 is a schematic cross-sectional view showing a third step in the method of manufacturing a silicon carbide semiconductor device according to the present embodiment.

Then, a step of forming a first region (S13: FIG. 14) is performed. First region 31 is formed (FIG. 17), for example, by implanting ions of a p-type impurity such as aluminum into a surface portion of second region 32. A concentration of the p-type impurity contained in first region 31 is higher than a concentration of the p-type impurity contained in second region 32. First region 31 has thickness H1, for example, not smaller than 0.1 μm and not greater than 1 μm. Thickness H2 of second region 32 is greater than thickness H1 of first region 31. Second region 32 has thickness H2, for example, not smaller than 3 μm and not greater than 7 μm. In first epitaxial layer 61, a region other than first region 31 and second region 32 serves as first pillar region 15. First region 31 and second region 32 form second pillar region 16.

Figure 18:
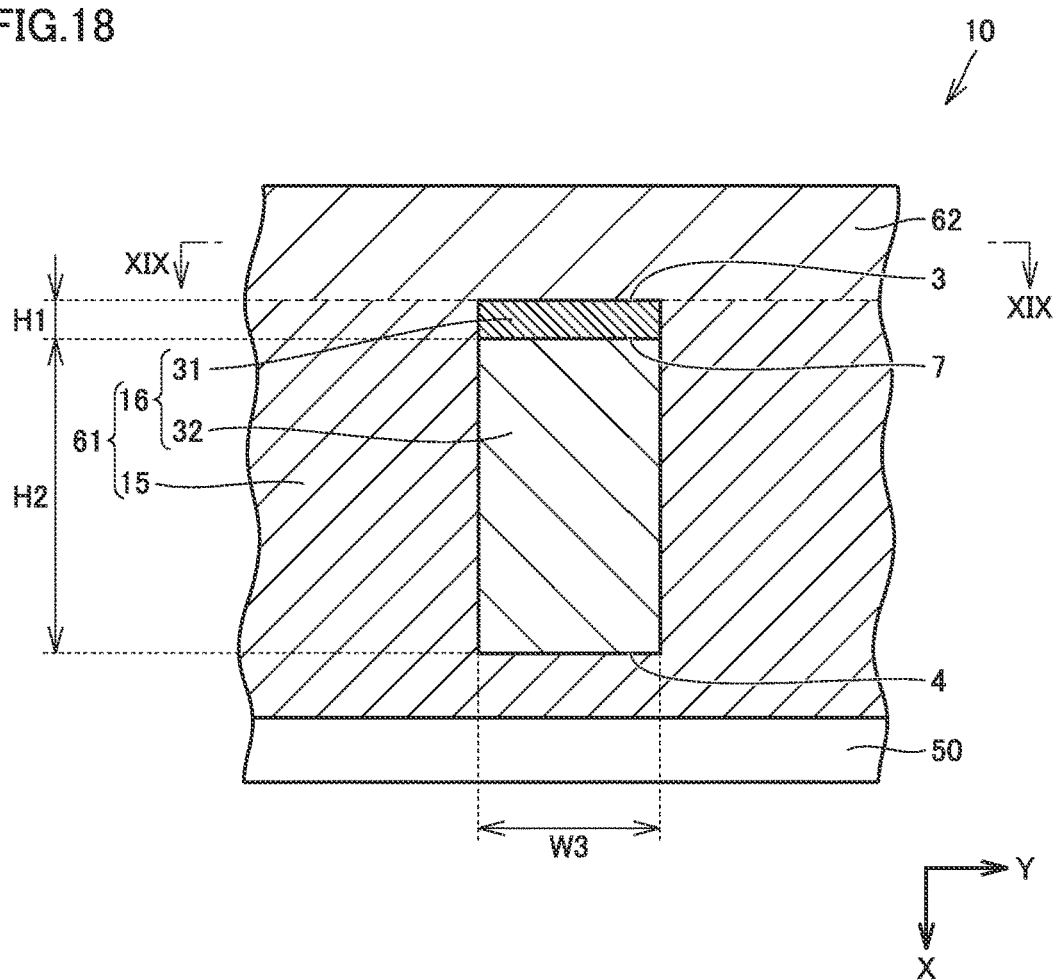
FIG. 18 is a schematic cross-sectional view along the line XVIII-XVIII in FIG. 19, which shows a fourth step in the method of manufacturing a silicon carbide semiconductor device according to the present embodiment.
Figure 19:
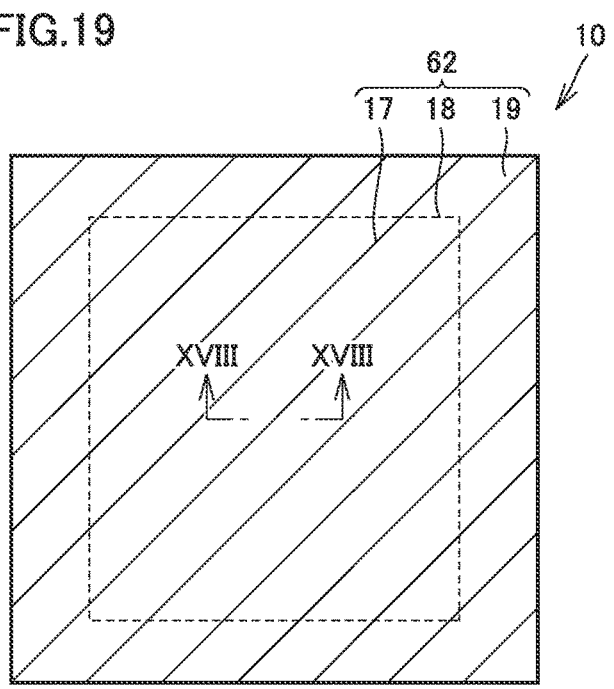
FIG. 19 is a schematic cross-sectional view along the line XIX-XIX in FIG. 18.

Then, a step of forming second epitaxial layer 62 (S14: FIG. 14) is performed. Second epitaxial layer 62 is formed on first epitaxial layer 61 (see FIG. 18) with CVD using, for example, a gas mixture of silane and propane as source material gas and using hydrogen as carrier gas. In epitaxial growth, an n-type impurity such as nitrogen is introduced into second epitaxial layer 62. Second epitaxial layer 62 has the n conductivity type. As shown in FIG. 19, second epitaxial layer 62 includes first portion 17 to be an active region and second portion 19 which surrounds first portion 17 and becomes a termination region. The termination region is a region where a voltage-withstanding structure such as a guard ring or a field stop is formed.

Figure 20:
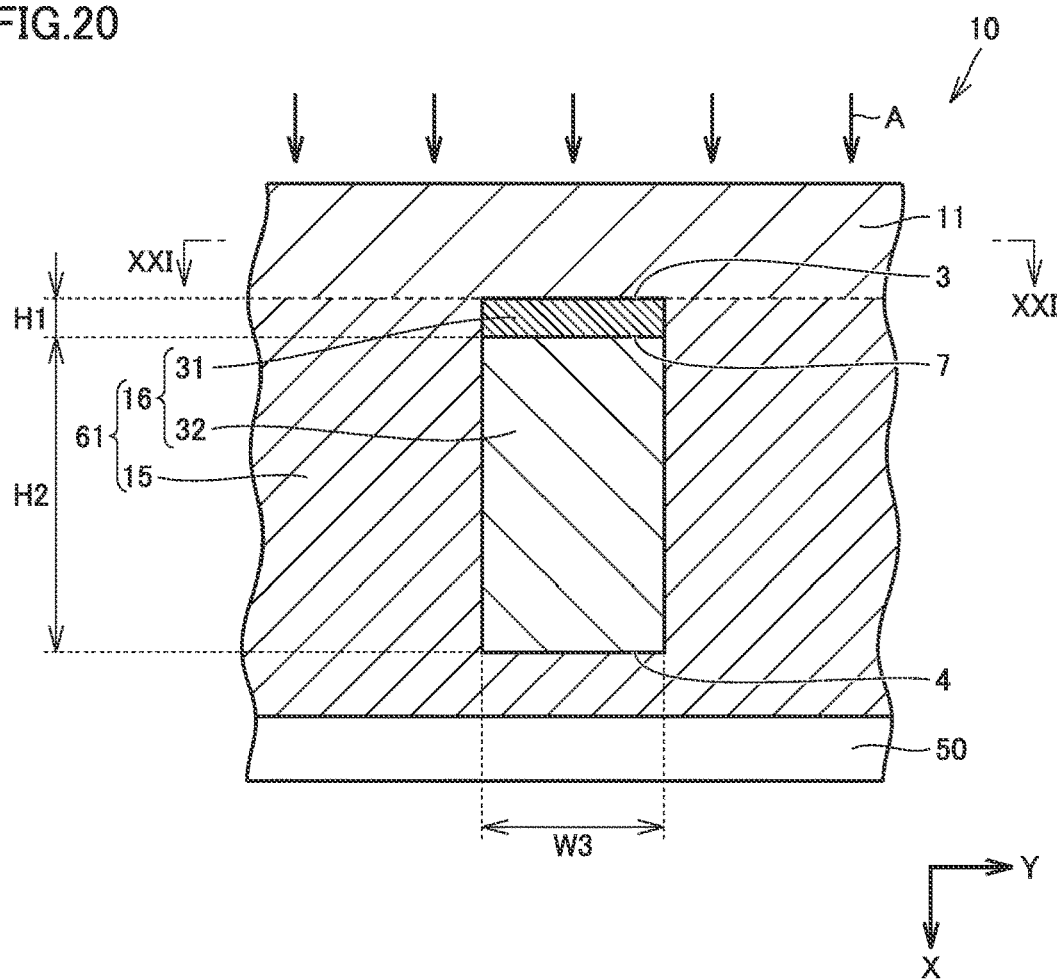
FIG. 20 is a schematic cross-sectional view along the line XX-XX in FIG. 21, which shows a fifth step in the method of manufacturing a silicon carbide semiconductor device according to the present embodiment.
Figure 21:
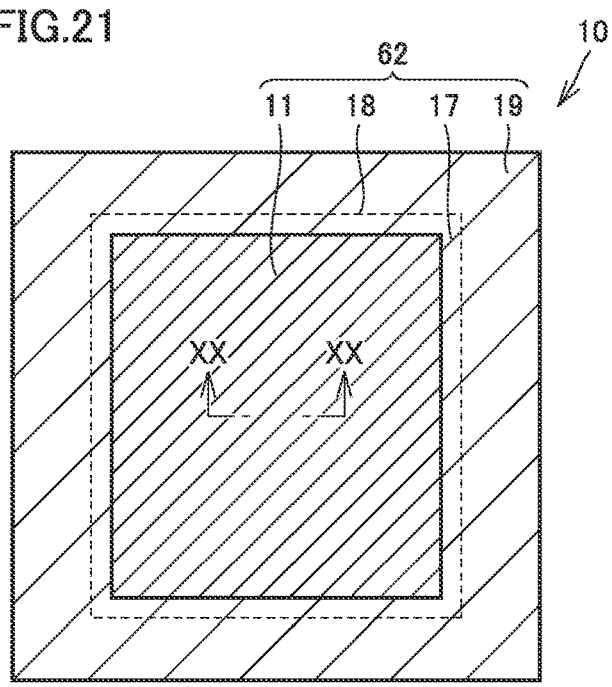
FIG. 21 is a schematic cross-sectional view along the line XXI-XXI in FIG. 20.

Then, a step of implanting n-type impurity ions (S15: FIG. 14) is performed. For example, ions of an n-type impurity which can provide the n-type such as nitrogen are implanted into second epitaxial layer 62 along a direction shown with an arrow A (see FIG. 20). Specifically, the n-type impurity ions are implanted into first portion 17 without implanting n-type impurity ions into second portion 19 (see FIG. 21). Current spread layer 11 is thus formed. As shown in FIG. 21, when viewed in the direction perpendicular to second main surface 2, current spread layer 11 is formed as being surrounded by a boundary portion 18 between first portion 17 and second portion 19. Current spread layer 11 is higher in concentration of the n-type impurity than second portion 19 in second epitaxial layer 62.

Figure 22:
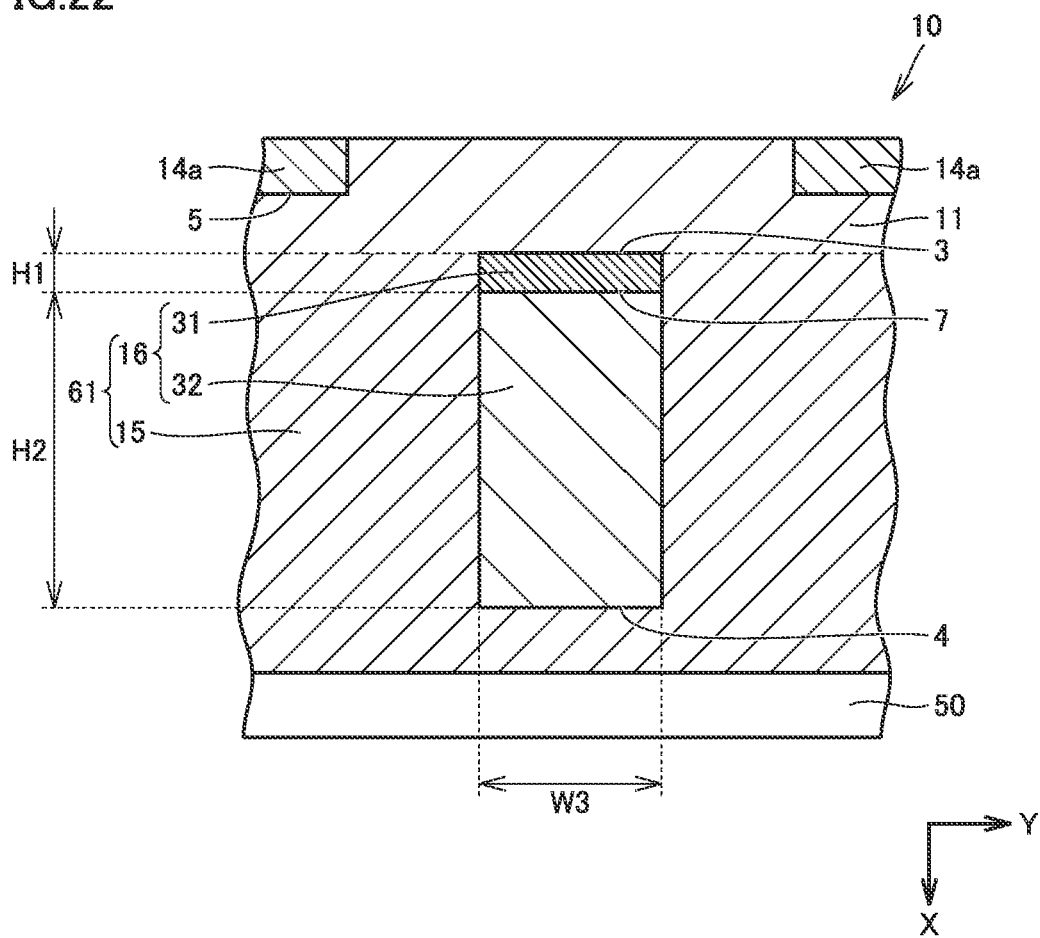
FIG. 22 is a schematic cross-sectional view showing a sixth step in the method of manufacturing a silicon carbide semiconductor device according to the present embodiment.

Then, a step of implanting p-type impurity ions (S16: FIG. 14) is performed. For example, a mask layer including an opening above a region where contact region 14 is to be formed is formed. Then, p-type impurity ions which can provide the p-type such as aluminum ions are implanted into second epitaxial layer 62. A first p-type region 14a is thus formed (see FIG. 22).

Figure 23:
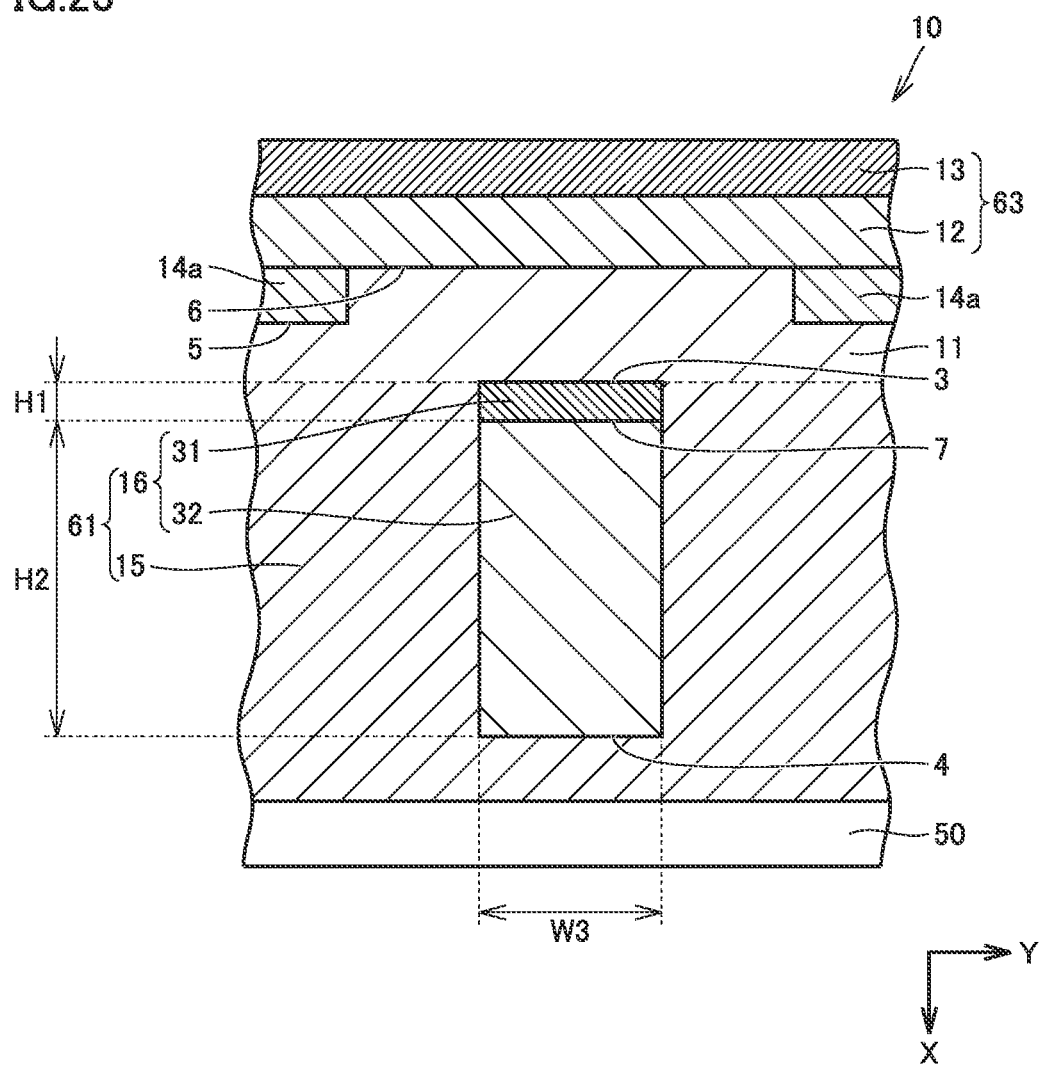
FIG. 23 is a schematic cross-sectional view showing a seventh step in the method of manufacturing a silicon carbide semiconductor device according to the present embodiment.

Then, a step of forming a third epitaxial layer 63 (S17: FIG. 14) is performed. Third epitaxial layer 63 is formed on second epitaxial layer 62 (see FIG. 18) with CVD using, for example, a gas mixture of silane and propane as source material gas and using hydrogen as carrier gas. In epitaxial growth, an n-type impurity such as nitrogen is introduced into third epitaxial layer 63. Third epitaxial layer 63 has the n conductivity type. Then, body region 12 is formed by implanting p-type impurity ions such as aluminum ions into third epitaxial layer 63. Then, source region 13 is formed by implanting n-type impurity ions such as phosphorus ions into body region 12 to a depth shallower than body region 12. Body region 12 and source region 13 form third epitaxial layer 63 (see FIG. 23).

Then, a step of implanting p-type impurity ions (S18: FIG. 14) is performed. For example, a mask layer (not shown) including an opening above a region where contact region 14 is to be formed is formed. Then, p-type impurity ions which can provide the p-type such as aluminum ions are implanted into third epitaxial layer 63. A second p-type region 14b is thus formed (see FIG. 22). Second p-type region 14b is formed to connect to first p-type region 14a. First p-type region 14a and second p-type region 14b form contact region 14. Contact region 14 and source region 13 define first main surface 1.

Activation annealing for activating impurity ions implanted into silicon carbide substrate 10 is performed. A temperature for activation annealing may be preferably not lower than 1500° C. and not higher than 1900° C. and set, for example, to approximately 1700° C. A time period for activation annealing is set, for example, to approximately thirty minutes. An atmosphere for activation annealing is preferably an inert gas atmosphere such as an Ar atmosphere.

Then, a step of providing a trench (S19: FIG. 14) is performed. Initially, a mask layer (not shown) including an opening is formed on first main surface 1. For example, a silicon oxide film can be employed as the mask layer. The opening is provided in correspondence with a position of trench TR (FIG. 1). Then, source region 13, body region 12, and a part of current spread layer 11 in the opening in the mask layer are etched away. For example, reactive ion etching and in particular inductively-coupled plasma reactive ion etching can be employed as an etching method. Specifically, inductively-coupled plasma reactive ion etching using $SF_6$ or a gas mixture of $SF_6$ and $O_2$ as reactive gas can be employed. Trench TR is provided by etching. Trench TR is defined by side surface SW substantially perpendicular to first main surface 1 and bottom portion BT continuous to side surface SW and substantially in parallel to first main surface 1. Width W1 of bottom portion BT of trench TR may be equal to, smaller than, or greater than width W3 of second pillar region 16.

Figure 24:
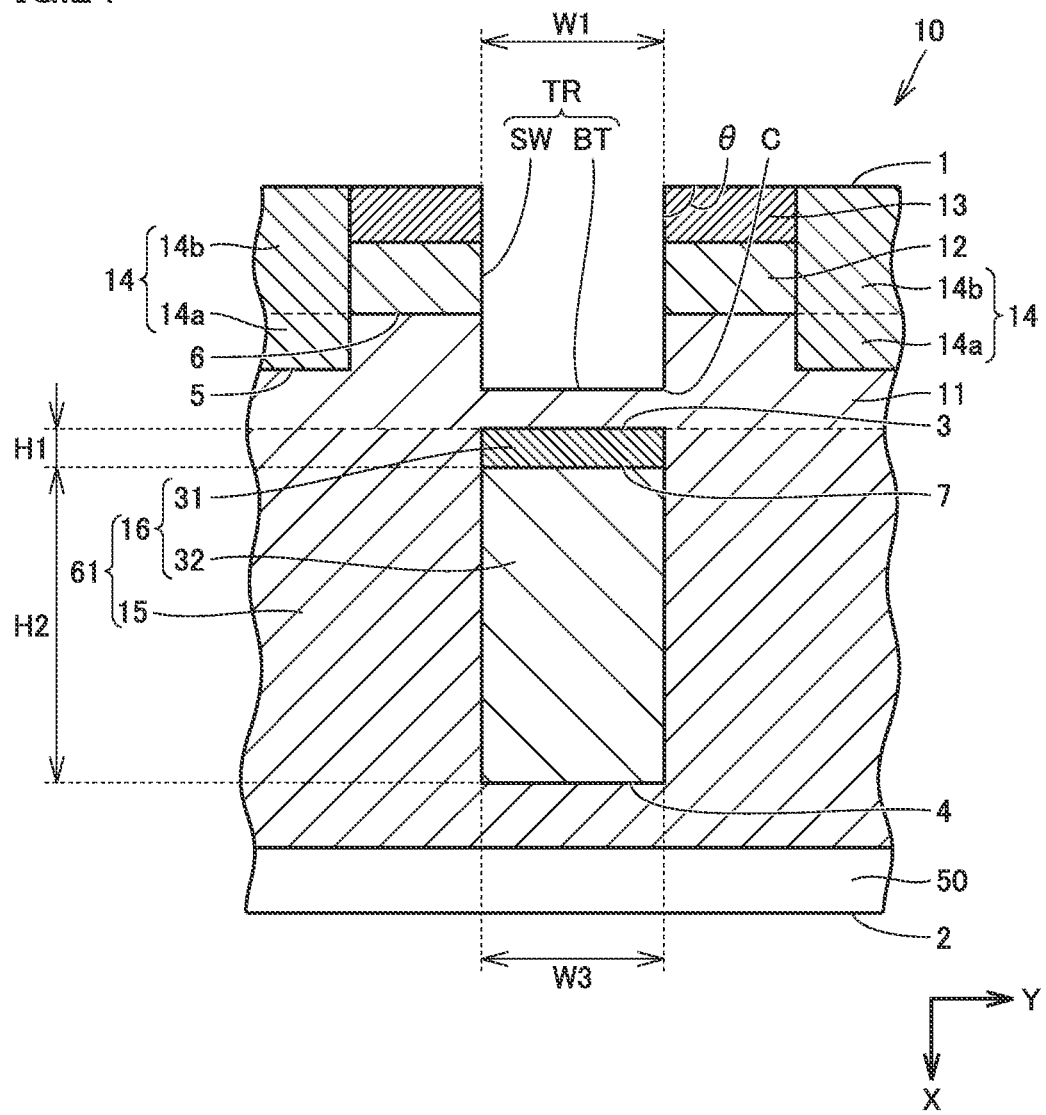
FIG. 24 is a schematic cross-sectional view showing an eighth step in the method of manufacturing a silicon carbide semiconductor device according to the present embodiment.

Silicon carbide substrate 10 is prepared as set forth above (see FIG. 24). Silicon carbide substrate 10 includes first main surface 1 and second main surface 2 opposite to first main surface 1. Silicon carbide substrate 10 includes current spread layer 11 having the n-type, body region 12 which is provided on current spread layer 11 and has the p-type, source region 13 which is provided on body region 12 as being distant from current spread layer 11 and has the n-type, contact region 14 which penetrates source region 13 and body region 12, is in contact with current spread layer 11, and has the p-type, first pillar region 15 which is in contact with current spread layer 11 and located between current spread layer 11 and second main surface 2 and has the n-type, and sixth impurity region 16 which is in contact with first pillar region 15 and has the p-type.

First main surface 1 is provided with trench TR defined by side surface SW which penetrates source region 13 and body region 12 and reaches first pillar region 15 and bottom portion BT continuous to side surface SW. Second pillar region 16 includes first region 31 which includes third main surface 3 facing bottom portion BT and second region 32 which is in contact with first region 31 and includes fourth main surface 4 facing second main surface 2. First region 31 is higher in concentration of the p-type impurity than second region 32. Contact region 14 includes fifth main surface 5 which faces the second main surface. Body region 12 includes sixth main surface 6 which faces second main surface 2. In the direction perpendicular to second main surface 2, fifth main surface 5 is located between sixth main surface 6 and second main surface 2.

Figure 25:
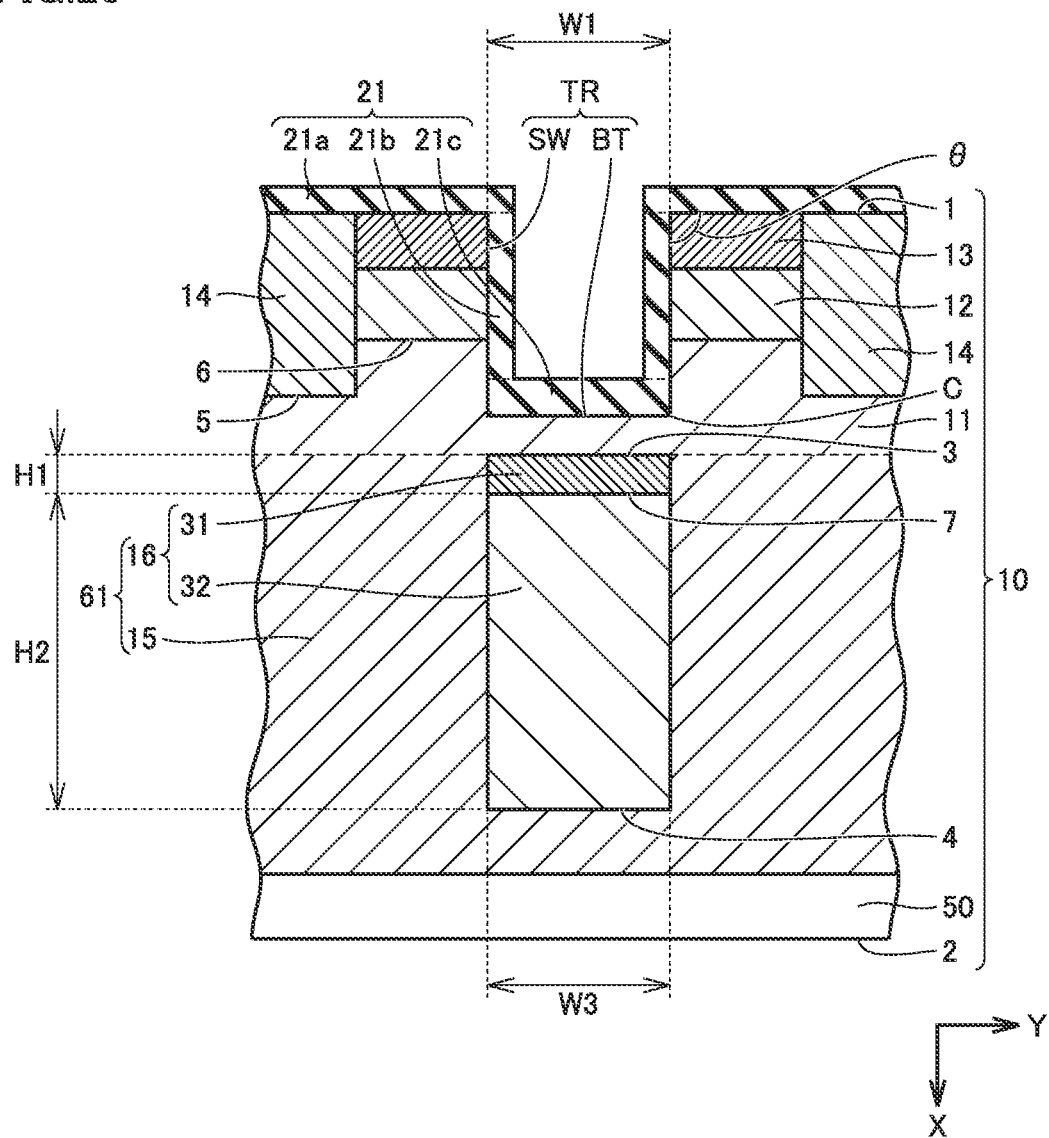
FIG. 25 is a schematic cross-sectional view showing a ninth step in the method of manufacturing a silicon carbide semiconductor device according to the present embodiment.

Then, a step of forming a gate insulating film (S20: FIG. 13) is performed. Gate insulating film 21 in contact with source region 13, body region 12, current spread layer 11, and contact region 14 is formed, for example, by thermally oxidizing silicon carbide substrate 10. Specifically, silicon carbide substrate 10 is heated at a temperature, for example, not lower than 1300° C. and not higher than 1400° C. in an atmosphere containing oxygen. Gate insulating film 21 in contact with first main surface 1 and side surface SW and bottom portion BT is thus formed (see FIG. 25).

Gate insulating film 21 includes, for example, first portion 21b in contact with side surface SW, second portion 21c in contact with bottom portion BT, and third portion 21a in contact with first main surface 1. Second portion 21c is greater in thickness than first portion 21b. Second portion 21c is in contact with current spread layer 11 at bottom portion BT. First portion 21b is in contact with each of source region 13, body region 12, and current spread layer 11 at side surface SW. Third portion 21a is in contact with source region 13 and contact region 14 at first main surface 1.

Then, silicon carbide substrate 10 may be subjected to heat treatment (NO annealing) in a nitric oxide (NO) gas atmosphere. In NO annealing, silicon carbide substrate 10 is held for approximately one hour, for example, under a condition not lower than 1100° C. and not higher than 1400° C. Nitrogen atoms are introduced into an interface region between gate insulating film 21 and body region 12. Consequently, formation of interface state at the interface region is suppressed and hence channel mobility can be improved.

After NO annealing, Ar annealing using argon (Ar) as atmospheric gas may be performed. Ar annealing is equal to or higher than NO annealing in heating temperature. A time period for Ar annealing is set, for example, to approximately one hour. Formation of interface state at the interface region between gate insulating film 21 and body region 12 is further suppressed. Another inert gas such as nitrogen gas instead of the Ar gas may be used as atmospheric gas.

Then, a step of forming a gate electrode (S30: FIG. 13) is performed. Gate electrode 24 is formed on gate insulating film 21. Gate electrode 24 is formed, for example, with low pressure chemical vapor deposition (LP-CVD). Gate electrode 24 is formed to face each of source region 13, body region 12, and current spread layer 11.

Then, a step of forming interlayer insulating film 22 (S40: FIG. 13) is performed. Specifically, interlayer insulating film 22 is formed to cover gate electrode 24 as being in contact with gate insulating film 21. Interlayer insulating film 22 is formed, for example, with CVD. Interlayer insulating film 22 is composed of a material containing, for example, silicon dioxide. A part of interlayer insulating film 22 may be formed in trench TR.

Figure 26:
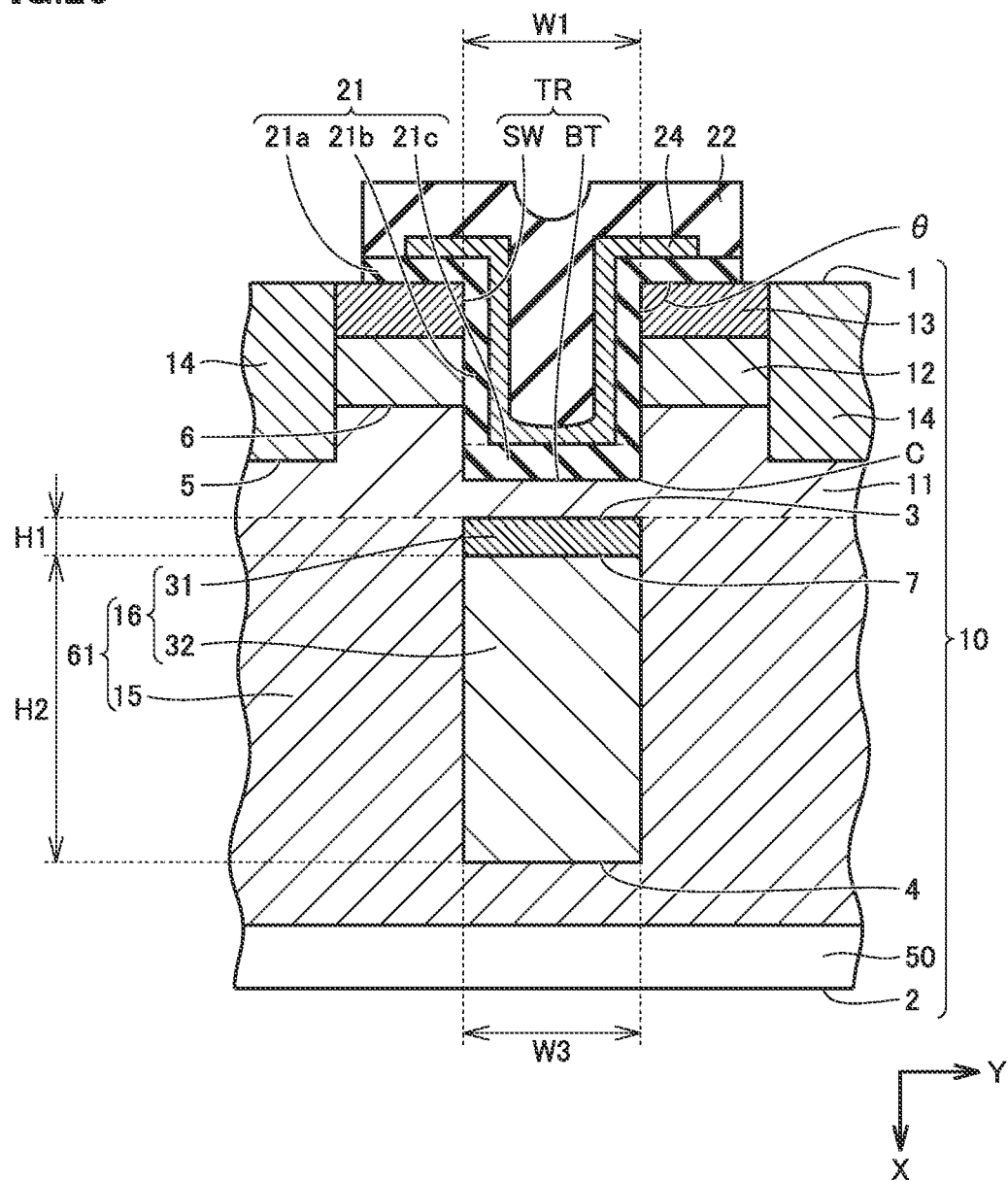
FIG. 26 is a schematic cross-sectional view showing a tenth step in the method of manufacturing a silicon carbide semiconductor device according to the present embodiment.

Then, a step of forming a source electrode (S50: FIG. 13) is performed. For example, etching is performed to provide an opening in interlayer insulating film 22 and gate insulating film 21, so that source region 13 and contact region 14 are exposed through interlayer insulating film 22 and gate insulating film 21 (see FIG. 26) in the opening. Then, source electrode 23 in contact with source region 13 and contact region 14 in first main surface 1 is formed. Source electrode 23 is formed, for example, with sputtering. Source electrode 23 is composed of a material containing, for example, Ti, Al, and Si.

Then, alloying annealing is performed. Source electrode 23 in contact with source region 13 and contact region 14 is held for approximately five minutes at a temperature, for example, not lower than 900° C. and not higher than 1100° C. At least a part of source electrode 23 thus reacts with silicon contained in silicon carbide substrate 10 and silicided. Source electrode 23 in ohmic contact with source region 13 is thus formed. Preferably, source electrode 23 is in ohmic contact with contact region 14.

Then, a step of forming a drain electrode (S60: FIG. 13) is performed. For example, drain electrode 20 in contact with second main surface 2 is formed with sputtering. Drain electrode 20 is composed of a material containing, for example, NiSi or TiAlSi. MOSFET 100 (FIG. 1) according to the present embodiment is completed as set forth above.

In providing trench TR of which angle θ formed between side surface SW and first main surface 1 is greater than 90°, thermal etching is desirably further performed in the step of providing a trench (S19: FIG. 14). Thermal etching can be performed, for example, by heating in an atmosphere containing reactive gas containing at least one type of halogen atoms. At least one type of halogen atoms includes at least any of chlorine (Cl) atoms and fluorine (F) atoms. The atmosphere contains, for example, $Cl_2$, $BCl_3$, $SF_6$, or $CF_4$. Thermal etching is performed, for example, by using a gas mixture of chlorine gas and oxygen gas as reaction gas and setting a heat treatment temperature to a temperature, for example, not lower than 700° C. and not higher than 1000° C. The reaction gas may contain carrier gas in addition to the chlorine gas and the oxygen gas described above. For example, nitrogen ($N_2$) gas, argon gas, or helium gas can be employed as the carrier gas. Side surface SW of trench TR is inclined by at least 50° and at most 70° relative to the (000-1) plane (see FIG. 8) as a result of thermal etching. Side surface SW may include, for example, the (0-33-8) plane.

Though description has been given in the embodiment with the n-type being defined as the first conductivity type and the p-type being defined as the second conductivity type, the p-type may be defined as the first conductivity type and the n-type may be defined as the second conductivity type. Though a MOSFET has been described as the silicon carbide semiconductor device by way of example in the embodiment, the silicon carbide semiconductor device may be, for example, an insulated gate bipolar transistor (IGBT).

Functions and effects of the MOSFET according to the present embodiment will now be described.

According to MOSFET 100 according to the present embodiment, silicon carbide substrate 10 includes first pillar region 15 having the n-type and second pillar region 16 which is in contact with first pillar region 15 and has the p-type. First pillar region 15 and second pillar region 16 form a super junction structure in which they mutually compensate for charges. Therefore, a breakdown voltage of MOSFET 100 can be improved.

Second pillar region 16 includes first region 31 which includes third main surface 3 facing bottom portion BT and second region 32 which is in contact with first region 31 and includes fourth main surface 4 facing second main surface 2. Thus, even when second region 32 is completely depleted in application of a reverse bias to the MOSFET, complete depletion of first region 31 can be suppressed. Consequently, concentration of electric field at bottom portion BT of trench TR can be suppressed.

Furthermore, in the direction perpendicular to second main surface 2, fifth main surface 5 of contact region 14 is located between sixth main surface 6 of body region 12 and second main surface 2. Therefore, an equipotential surface is formed between contact region 14 and first region 31. Since contact region 14 is connected to source electrode 23, the equipotential surface is closer to a potential (that is, 0 V) of source electrode 23. Consequently, concentration of electric field at bottom portion BT of trench TR can be suppressed. Therefore, breakdown of the gate insulating film can be suppressed. Therefore, reliability of the gate insulating film can be improved.

According to MOSFET 100 according to the present embodiment, a maximum value of the impurity concentration in first region 31 is at least ten times as large as an average value of the impurity concentration in second region 32. Thus, depletion of first region 31 in application of a reverse bias to MOSFET 100 can further be suppressed. Consequently, concentration of electric field at bottom portion BT of trench TR can be suppressed.

According to MOSFET 100 according to the present embodiment, first region 31 is distant from bottom portion BT. A region where a current flows can thus be wider, and consequently an on resistance can be lowered.

According to MOSFET 100 according to the present embodiment, in a direction in parallel to second main surface 2, a width of second region 32 is equal to or greater than a width of bottom portion BT. Concentration of electric field at bottom portion BT of trench TR can thus be relaxed.

According to MOSFET 100 according to the present embodiment, in the direction in parallel to second main surface 2, the width of bottom portion BT is equal to or greater than a width of third main surface 3. A region where a current flows can thus be wider, and consequently an on resistance can be lowered.

According to MOSFET 100 according to the present embodiment, in a direction in parallel to second main surface 2, a width of third main surface 3 is equal to or smaller than a width of second region 32. A region where a current flows can thus be wider, and consequently an on resistance can be lowered.

According to MOSFET 100 according to the present embodiment, angle θ formed between side surface SW and first main surface 1 is not smaller than 90°. Mobility in a channel region can thus be enhanced. Consequently, an on resistance can be lowered.

According to MOSFET 100 according to the present embodiment, a concentration of an n-type impurity in current spread layer 11 is higher than $2 \times 10^{16}$ cm$^{-3}$ and lower than $1 \times 10^{18}$ cm$^{-3}$. A high breakdown voltage can thus be maintained while an on resistance is lowered.

According to MOSFET 100 according to the present embodiment, a concentration of a p-type impurity in first region 31 may be higher than a concentration of an n-type impurity in current spread layer 11. Thus, a depletion layer can extend to current spread layer 11 in application of a reverse bias to the silicon carbide semiconductor device. Consequently, concentration of electric field at bottom portion BT of trench TR can be suppressed.

According to MOSFET 100 according to the present embodiment, current spread layer 11 is higher in impurity concentration than first pillar region 15. An on resistance can thus be lowered.

According to MOSFET 100 according to the present embodiment, body region 12 is higher in impurity concentration than current spread layer 11. Thus, punch-through of body region 12 due to extension of a depletion layer into body region 12 from a boundary between body region 12 and current spread layer 11 can be suppressed. According to MOSFET 100 according to the present embodiment, a concentration of an n-type impurity in source region 13 is higher than a concentration of a p-type impurity in body region 12. Thus, punch-through of body region 12 due to extension of a depletion layer into body region 12 from a boundary between body region 12 and source region 13 can be suppressed.

According to MOSFET 100 according to the present embodiment, in the direction perpendicular to second main surface 2, first region 31 has a thickness not smaller than 0.1 μm. Concentration of electric field at bottom portion BT of trench TR can further be suppressed.

According to MOSFET 100 according to the present embodiment, gate insulating film 21 includes first portion 21b in contact with side surface SW and second portion 21c in contact with bottom portion BT. Second portion 21c is greater in thickness than first portion 21b. Breakdown of the gate insulating film can thus be suppressed even though high electric field is applied to bottom portion BT.

According to MOSFET 100 according to the present embodiment, in the direction perpendicular to second main surface 2, fifth main surface 5 is located between sixth main surface 6 and bottom portion BT. Since a region where a current flows can thus be wider, an on resistance can further be lowered.

According to MOSFET 100 according to the present embodiment, in the direction perpendicular to second main surface 2, fifth main surface 5 may be located between bottom portion BT and third main surface 3. Concentration of electric field at bottom portion BT of trench TR can thus be suppressed while an on resistance is lowered.

According to MOSFET 100 according to the present embodiment, in the direction perpendicular to second main surface 2, fifth main surface 5 may be located between third main surface 3 and boundary surface 7 between first region 31 and second region 32. An equipotential surface is thus more readily formed between contact region 14 and first region 31. Consequently, concentration of electric field at bottom portion BT of trench TR can further be suppressed.

According to the method of manufacturing MOSFET 100 according to the present embodiment, silicon carbide substrate 10 includes first pillar region 15 having the n-type and second pillar region 16 which is in contact with first pillar region 15 and has the p-type. First pillar region 15 and second pillar region 16 form a super junction structure in which they mutually compensate for charges. Therefore, a breakdown voltage of MOSFET 100 can be improved.

Second pillar region 16 includes first region 31 which includes third main surface 3 facing bottom portion BT and second region 32 which is in contact with first region 31 and includes fourth main surface 4 facing second main surface 2. Thus, even when second region 32 is completely depleted in application of a reverse bias to the MOSFET, complete depletion of first region 31 can be suppressed. Consequently, concentration of electric field at bottom portion BT of trench TR can be suppressed.

Furthermore, in the direction perpendicular to second main surface 2, fifth main surface 5 of contact region 14 is located between sixth main surface 6 of body region 12 and second main surface 2. Therefore, an equipotential surface is formed between contact region 14 and first region 31. Since contact region 14 is connected to source electrode 23, the equipotential surface is closer to a potential (that is, 0 V) of source electrode 23. Consequently, concentration of electric field at bottom portion BT of trench TR can be suppressed. Therefore, breakdown of the gate insulating film can be suppressed. Therefore, reliability of the gate insulating film can be improved.

According to the method of manufacturing MOSFET 100 according to the present embodiment, the preparing silicon carbide substrate 10 includes forming first epitaxial layer 61 of the first conductivity type, forming second epitaxial layer 62 of the first conductivity type on first epitaxial layer 61, and implanting impurity ions which can provide the first conductivity type into second epitaxial layer 62. Second epitaxial layer 62 includes first portion 17 to be an active region and second portion 19 which surrounds first portion 17 and becomes a termination region. In the implanting impurity ions, first impurity region 11 is formed by implanting the impurity ions into first portion 17 without implanting the impurity ions into second portion 19. An on resistance can be lowered by making an impurity concentration in first portion 17 to be an active region higher. A high breakdown voltage can be maintained by lowering an impurity concentration in second portion 19 to be a termination region.

EXAMPLE 1

Figure 27:
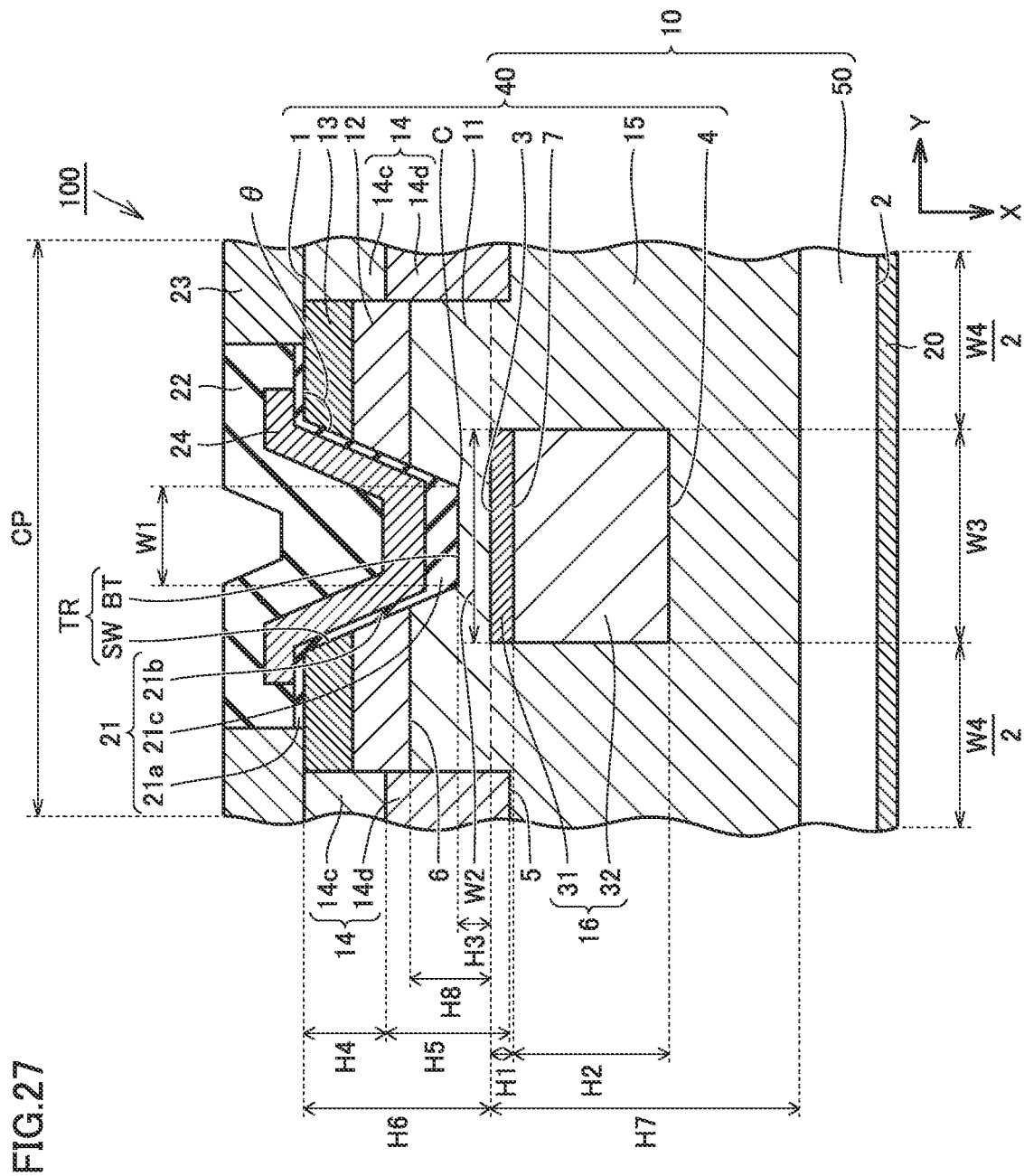
FIG. 27 is a schematic cross-sectional view showing a structure of a MOSFET according to Examples 1 and 2.

Initially, four simulation samples different in concentration of an n-type impurity in current spread layer 11 were prepared (see FIG. 27). Specifically, concentrations of the n-type impurity in current spread layers 11 in MOSFETs according to samples 1 to 4 were set to $5\times10^{15}$ cm$^{-3}$, $1\times10^{16}$ cm$^{-3}$, $1\times10^{17}$ cm$^{-3}$, and $1\times10^{18}$ cm$^{-3}$, respectively. The MOSFETs according to samples 1 to 4 are similar to one another in construction except for the concentration of the n-type impurity in current spread layer 11. Specifically, as shown in FIG. 27, silicon carbide epitaxial layer 40 of the MOSFET mainly includes current spread layer 11, body region 12, source region 13, contact region 14, first pillar region 15, and second pillar region 16.

Current spread layer 11 had a thickness H8 of 1 μm. A second epitaxial layer had a thickness H6 of 1.5 μm. A concentration of an n-type impurity contained in first pillar region 15 was set to $3\times10^{16}$ cm$^{-3}$. First pillar region 15 had a thickness H7 of 6 μm. First pillar region 15 had a width W4 of 5.0 μm. Second pillar region 16 included first region 31 and second region 32. A concentration of a p-type impurity contained in first region 31 was $2\times10^{18}$ cm$^{-3}$. A concentration of a p-type impurity contained in second region 32 was $7\times10^{16}$ cm$^{-3}$. Second region 32 had thickness H2 of 3 μm. Second pillar region 16 had width W3 of 2.0 μm. Contact region 14 included a first contact region portion 14c and a second contact region portion 14d. A concentration of a p-type impurity contained in first contact region portion 14c was $1\times10^{20}$ cm$^{-3}$. First contact region portion 14c had a thickness H4 of 0.5 μm. A concentration of a p-type impurity contained in second contact region portion 14d was $8\times10^{17}$ cm$^{-3}$. Second contact region portion 14d had a thickness H5 of 1.3 μm.

Figure 28:
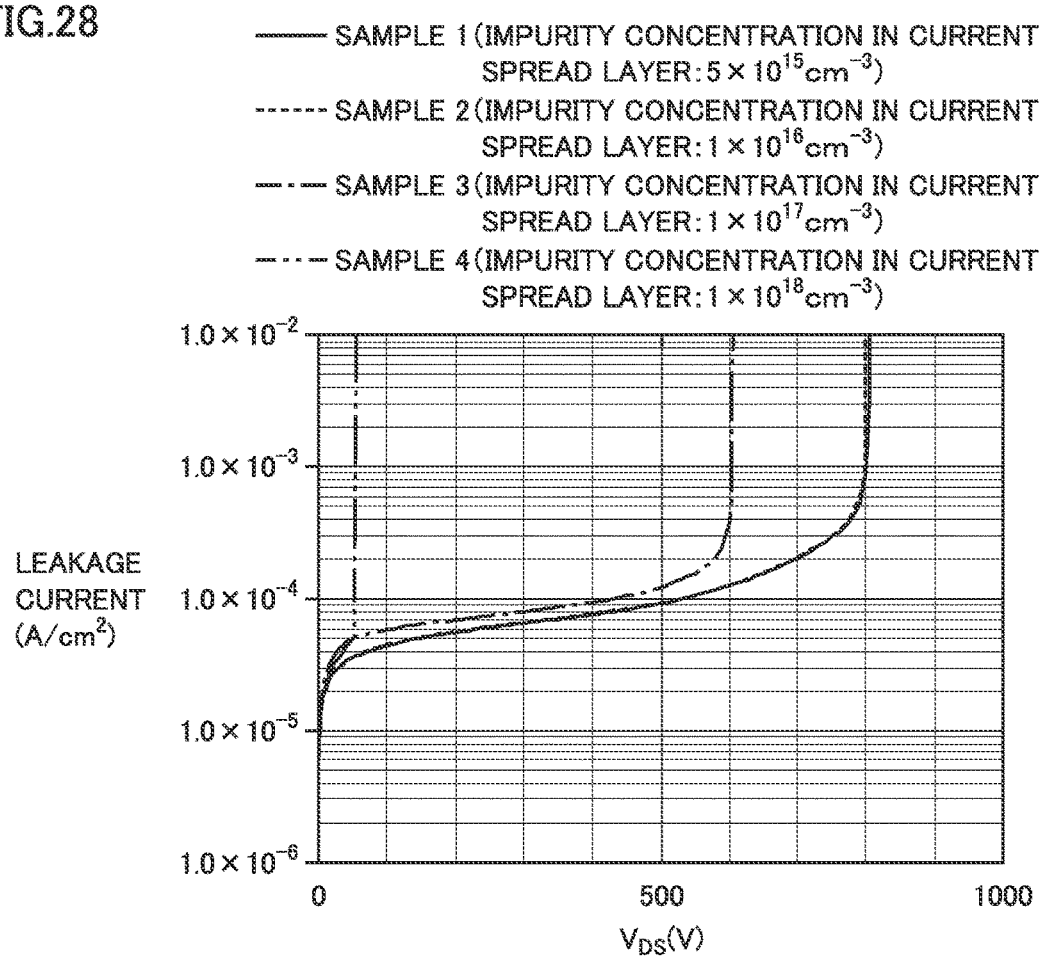
FIG. 28 is a diagram showing relation between a leakage current and a voltage ($V_{DS}$) across a drain electrode and a source electrode.

Relation between current spread layer 11 and a breakdown voltage of the MOSFETs was examined by using the MOSFETs according to samples 1 to 4. Specifically, relation between a voltage $V_{DS}$ applied across the drain electrode and the source electrode and a leakage current was found through simulation. As shown in FIG. 28, the MOSFETs according to samples 1 and 2 each had a breakdown voltage of approximately 800 V. The MOSFETs according to samples 3 and 4 had breakdown voltages of approximately 600 V and approximately 50 V, respectively. $V_{DS}$ at a leakage current of $1\times10^{-2}$ A/cm$^2$ was assumed as a breakdown voltage. When a concentration of the n-type impurity in current spread layer 11 was $1\times10^{17}$ cm$^{-3}$ (sample 3), capability to maintain a breakdown voltage was achieved. When a concentration of the n-type impurity in current spread layer 11 was $1\times10^{18}$ cm$^{-3}$ (sample 4), however, capability to maintain a breakdown voltage abruptly lowered. It was clarified by the results above that it was desirable to set a concentration of the n-type impurity in current spread layer 11 to be lower than $1\times10^{18}$ cm$^{-3}$.

EXAMPLE 2

Nine simulation samples different in concentration of an n-type impurity in current spread layer 11 were prepared (see FIG. 27). Specifically, concentrations of the n-type impurity in current spread layers 11 in MOSFETs according to the nine types of samples were set to $1.3\times10^{16}$ cm$^{-3}$, $1.5\times10^{16}$ cm$^{-3}$, $2.0\times10^{16}$ cm$^{-3}$, $3.0\times10^{16}$ cm$^{-3}$, $5.0\times10^{16}$ cm$^{-3}$, $1.0\times10^{17}$ cm$^{-3}$, $2.0\times10^{17}$ cm$^{-3}$, $5.0\times10^{17}$ cm$^{-3}$, and $1\times10^{18}$ cm$^{-3}$, respectively. The MOSFET according to Example 2 is similar to the MOSFET according to Example 1 in construction except for the concentration of the n-type impurity in current spread layer 11.

Figure 29:
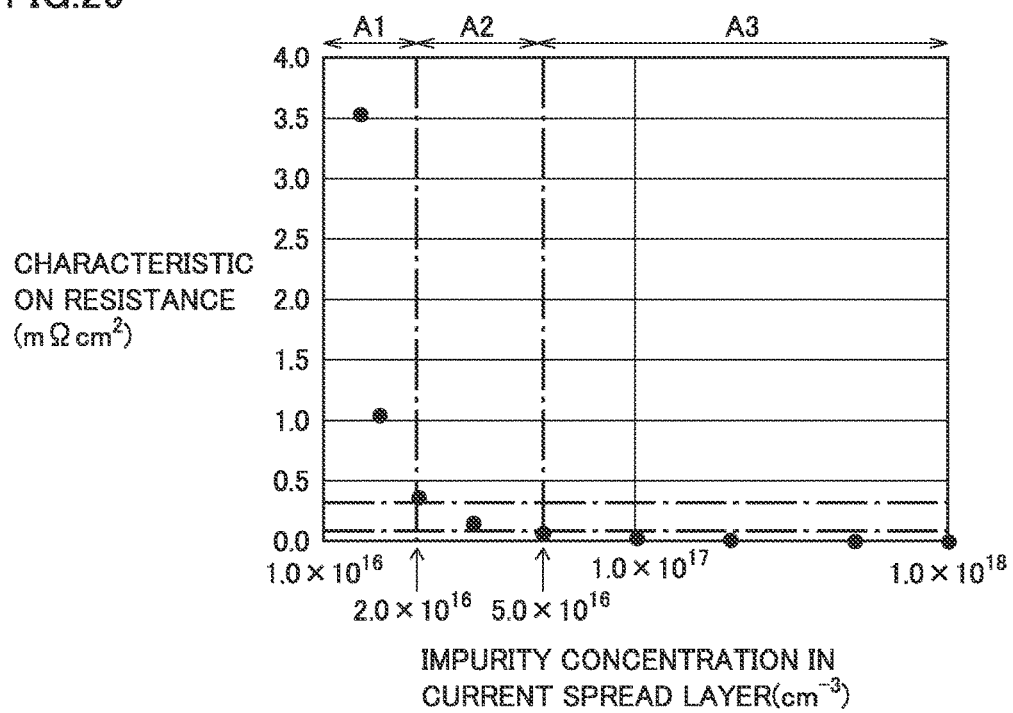
FIG. 29 is a diagram showing relation between a characteristic on resistance and an impurity concentration in a current spread layer.

A characteristic on resistance was calculated through simulation by using the MOSFET according to Example 2. A voltage across the drain electrode and the source electrode was set to 2 V. A gate voltage was set to 15 V. As shown in FIG. 29, characteristic on resistances of the MOSFETs according to the nine types of samples were 3.5404 mΩcm$^2$, 1.0520 mΩcm$^2$, 0.3707 mΩcm$^2$, 0.1582 mΩcm$^2$, 0.0739 mΩcm$^2$, 0.0332 mΩcm$^2$, 0.0173 mΩcm$^2$, 0.0084 mΩcm$^2$, and 0.0053 mΩcm$^2$, respectively. An on resistance of the MOSFET can be categorized into a channel resistance, a drift resistance, a substrate resistance, and other resistances. When a total of on resistances of the MOSFET shown in FIG. 27 is standardized as 1 mΩcm$^2$, the channel resistance, the drift resistance, the substrate resistance, and other resistances were 0.4 mΩcm$^2$, 0.3 mΩcm$^2$, 0.2 mΩcm$^2$, and 0.1 mΩcm$^2$, respectively. As shown in FIG. 29, in a region A1, the current spread layer was higher in resistance than other components, and a resistance of the current spread layer is dominant. In a region A2, the current spread layer is substantially equal in resistance to other components. In a region A3, the current spread layer is lower in resistance than other components and variation in resistance of the current spread layer with respect to variation in impurity concentration is ignorably minor.

A resistance of the current spread layer is desirably not higher than a drift resistance (that is, a resistance of the first pillar region). Specifically, the current spread layer has a resistance desirably not higher than 0.3 mΩcm$^2$. In this case, the current spread layer is higher than $2.0\times10^{16}$ cm$^{-3}$. A resistance of the current spread layer is more desirably equal to or lower than other resistances. Specifically, a resistance of the current spread layer is more desirably not higher than 0.1 mΩcm$^2$. In this case, the current spread layer is not lower than $5.0\times10^{16}$ cm$^{-3}$. It was clarified by the results above that a concentration of the n-type impurity in current spread layer 11 was desirably higher than $2\times10^{16}$ cm$^{-3}$.

It should be understood that the embodiment disclosed herein is illustrative and non-restrictive in every respect. The scope of the present invention is defined by the terms of the claims rather than the description above and is intended to include any modifications within the scope and meaning equivalent to the terms of the claims.

REFERENCE SIGNS LIST 1 first main surface; 2 second main surface; 3 third main surface; 4 fourth main surface; 5 fifth main surface; 6 sixth main surface; 7 boundary surface; 10 silicon carbide substrate; 11 current spread layer (first impurity region); 12 body region (second impurity region); 13 source region (third impurity region); 14 contact region (fourth impurity region); 14a first p-type region; 14b second p-type region; 15 first pillar region (fifth impurity region); 16 second pillar region (sixth impurity region); 17, 21b first portion; 18 boundary portion; 19, 21c second portion; 20 drain electrode (second electrode); 21 gate insulating film; 21a third portion; 22 interlayer insulating film; 23 source electrode (first electrode); 24 gate electrode; 31 first region; 32 second region; 33 connection portion; 40 silicon carbide epitaxial layer; 50 silicon carbide single crystal substrate; 61 first epitaxial layer; 62 second epitaxial layer; 63 third epitaxial layer; 100 silicon carbide semiconductor device (MOSFET); BT bottom portion; C corner portion; SW side surface; and TR trench

The invention claimed is:
1. A silicon carbide semiconductor device comprising:
   a silicon carbide substrate including a first main surface and a second main surface opposite to the first main surface, the silicon carbide substrate including
   a first impurity region having a first conductivity type, a second impurity region which is provided on the first impurity region and has a second conductivity type different from the first conductivity type, a third impurity region which is provided on the second impurity region as being distant from the first impurity region and has the first conductivity type, a fourth impurity region which penetrates the third impurity region and the second impurity region, is in contact with the first impurity region, and has the second conductivity type, a fifth impurity region which is in contact with the first impurity region and located between the first impurity region and the second main surface and has the first conductivity type, and a sixth impurity region which is in contact with the fifth impurity region and has the second conductivity type, the first main surface being provided with a trench defined by a side surface which penetrates the third impurity region and the second impurity region and reaches the first impurity region and a bottom portion continuous to the side surface, the sixth impurity region including a first region which includes a third main surface facing the bottom portion and a second region which is in contact with the first region and includes a fourth main surface facing the second main surface, the first region being higher in impurity concentration than the second region, the fourth impurity region including a fifth main surface which faces the second main surface, the second impurity region including a sixth main surface which faces the second main surface, in a direction perpendicular to the second main surface, the fifth main surface being located between the sixth main surface and the second main surface;

a gate insulating film in contact with the side surface and the bottom portion;

a first electrode in contact with the third impurity region and the fourth impurity region in the first main surface; and a second electrode in contact with the second main surface, and wherein the first impurity region is disposed between the bottom portion and the third main surface.

2. The silicon carbide semiconductor device according to claim 1, wherein a maximum value of the impurity concentration in the first region is at least ten times as large as an average value of the impurity concentration in the second region.

3. The silicon carbide semiconductor device according to claim 1, wherein the first region is distant from the bottom portion.

4. The silicon carbide semiconductor device according to claim 1, wherein in a direction in parallel to the second main surface, a width of the second region is equal to or greater than a width of the bottom portion.

5. The silicon carbide semiconductor device according to claim 4, wherein in the direction in parallel to the second main surface, the width of the bottom portion is equal to or greater than a width of the third main surface.

6. The silicon carbide semiconductor device according to claim 1, wherein in a direction in parallel to the second main surface, a width of the third main surface is equal to or smaller than a width of the second region.

7. The silicon carbide semiconductor device according to claim 1, wherein an angle formed between the side surface and the first main surface is not smaller than 90°.

8. The silicon carbide semiconductor device according to claim 1, wherein the impurity concentration in the first impurity region is higher than $2\times10^{16}$ cm$^{-3}$ and lower than $1\times10^{18}$ cm$^{-3}$.

9. The silicon carbide semiconductor device according to claim 1, wherein the first region is higher in impurity concentration than the first impurity region.

10. The silicon carbide semiconductor device according to claim 1, wherein the first impurity region is higher in impurity concentration than the fifth impurity region.

11. The silicon carbide semiconductor device according to claim 1, wherein the second impurity region is higher in impurity concentration than the first impurity region.

12. The silicon carbide semiconductor device according to claim 1, wherein in the direction perpendicular to the second main surface, the first region has a thickness not smaller than 0.1 µm.

13. The silicon carbide semiconductor device according to claim 1, wherein the gate insulating film includes a first portion in contact with the side surface and a second portion in contact with the bottom portion, and the second portion is greater in thickness than the first portion.

14. The silicon carbide semiconductor device according to claim 1, wherein in the direction perpendicular to the second main surface, the fifth main surface is located between the sixth main surface and the bottom portion.

15. The silicon carbide semiconductor device according to claim 1, wherein in the direction perpendicular to the second main surface, the fifth main surface is located between the bottom portion and the third main surface.

16. The silicon carbide semiconductor device according to claim 1, wherein in the direction perpendicular to the second main surface, the fifth main surface is located between the third main surface and a boundary surface between the first region and the second region.

17. A method of manufacturing a silicon carbide semiconductor device comprising:

preparing a silicon carbide substrate including a first main surface and a second main surface opposite to the first main surface, the silicon carbide substrate including a first impurity region having a first conductivity type, a second impurity region which is provided on the first impurity region and has a second conductivity type different from the first conductivity type, a third impurity region which is provided on the second impurity region as being distant from the first impurity region and has the first conductivity type, a fourth impurity region which penetrates the third impurity region and the second impurity region, is in contact with the first impurity region, and has the second conductivity type, a fifth impurity region which is in contact with the first impurity region and located between the first impurity region and the second main surface and has the first conductivity type, and a sixth impurity region which is in contact with the fifth impurity region and has the second conductivity type, the first main surface being provided with a trench defined by a side surface which penetrates the third impurity region and the second impurity region and reaches the first impurity region and a bottom portion continuous to the side surface, the sixth impurity region including a first region which includes a third main surface facing the bottom portion and a second region which is in contact with the first region and includes a fourth main surface facing the second main surface, the first region being higher in impurity concentration than the second region, the fourth impurity region including a fifth main surface which faces the second main surface, the second impurity region including a sixth main surface which faces the second main surface, in a direction perpendicular to the second main surface, the fifth main surface being located between the sixth main surface and the second main surface;

forming a gate insulating film in contact with the side surface and the bottom portion;

forming a first electrode in contact with the third impurity region and the fourth impurity region in the first main surface; and forming a second electrode in contact with the second main surface, and wherein the first impurity region is disposed between the bottom portion and the third main surface.

18. The method of manufacturing a silicon carbide semiconductor device according to claim 17, wherein the preparing a silicon carbide substrate includes forming a first epitaxial layer of the first conductivity type, forming a second epitaxial layer of the first conductivity type on the first epitaxial layer, and implanting impurity ions which can provide the first conductivity type into the second epitaxial layer, the second epitaxial layer includes a first portion to be an active region and a second portion which surrounds the first portion and becomes a termination region, and in the implanting impurity ions, the first impurity region is formed by implanting the impurity ions into the first portion without implanting the impurity ions into the second portion.

* * * * *